US011282856B2

(12) United States Patent
Choi et al.

(10) Patent No.: US 11,282,856 B2
(45) Date of Patent: Mar. 22, 2022

(54) SEMICONDUCTOR DEVICE AND METHOD OF FABRICATING THE SAME

(71) Applicant: Samsung Electronics Co., Ltd., Suwon-si (KR)

(72) Inventors: Ji-Hoon Choi, Seongnam-si (KR); Sunggil Kim, Hwasung-si (KR); Seulye Kim, Seoul (KR); HongSuk Kim, Yongin-si (KR); Phil Ouk Nam, Suwon-si (KR); Jaeyoung Ahn, Seongnam-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 16/845,615

(22) Filed: Apr. 10, 2020

(65) Prior Publication Data

US 2020/0243558 A1 Jul. 30, 2020

Related U.S. Application Data

(62) Division of application No. 15/864,410, filed on Jan. 8, 2018, now Pat. No. 10,651,191.

(30) Foreign Application Priority Data

Apr. 28, 2017 (KR) .......................... 10-2017-0055497

(51) Int. Cl.
*H01L 27/11582* (2017.01)
*H01L 27/11524* (2017.01)
(Continued)

(52) U.S. Cl.
CPC .. *H01L 27/11582* (2013.01); *H01L 21/02532* (2013.01); *H01L 21/02592* (2013.01);
(Continued)

(58) Field of Classification Search
None
See application file for complete search history.

(56) References Cited

U.S. PATENT DOCUMENTS

| 181,271 | A | * | 8/1876 | King | E05F 11/00 |
| | | | | | 292/238 |
| 263,635 | A | * | 8/1882 | Wehrle et al. | C22B 11/10 |
| | | | | | 209/42 |

(Continued)

FOREIGN PATENT DOCUMENTS

| CN | 107919362 A | 4/2018 |
| KR | 10-2014-0100332 A | 8/2014 |

(Continued)

*Primary Examiner* — Zandra V Smith
*Assistant Examiner* — Lawrence C Tynes, Jr.
(74) *Attorney, Agent, or Firm* — Harness, Dickey & Pierce, P.L.C.

(57) ABSTRACT

A semiconductor device may include a substrate, an electrode structure including electrodes stacked on the substrate, an upper semiconductor pattern penetrating at least a portion of the electrode structure, and a lower semiconductor pattern between the substrate and the upper semiconductor pattern. The upper semiconductor pattern includes a gap-filling portion and a sidewall portion extending from the gap-filling portion in a direction away from the substrate, the lower semiconductor pattern includes a concave top surface, the gap-filling portion fills a region enclosed by the concave top surface, a top surface of the gap-filling portion has a rounded shape that is deformed toward the substrate, and a thickness of the sidewall portion is less than a thickness of the gap-filling portion.

8 Claims, 20 Drawing Sheets

(51) Int. Cl.
  *H01L 27/11556* (2017.01)
  *H01L 27/1157* (2017.01)
  *H01L 21/02* (2006.01)
  *H01L 21/306* (2006.01)
  *H01L 21/3065* (2006.01)
  *H01L 27/11573* (2017.01)
  *H01L 27/11575* (2017.01)
  *H01L 29/792* (2006.01)
  *H01L 29/423* (2006.01)
  *H01L 29/04* (2006.01)
  *H01L 27/11565* (2017.01)
  *H01L 29/51* (2006.01)

(52) U.S. Cl.
  CPC .... *H01L 21/02667* (2013.01); *H01L 21/3065* (2013.01); *H01L 21/30604* (2013.01); *H01L 27/1157* (2013.01); *H01L 27/11524* (2013.01); *H01L 27/11556* (2013.01); *H01L 27/11565* (2013.01); *H01L 27/11573* (2013.01); *H01L 27/11575* (2013.01); *H01L 29/04* (2013.01); *H01L 29/42364* (2013.01); *H01L 29/7926* (2013.01); *H01L 29/4236* (2013.01); *H01L 29/511* (2013.01)

(56) References Cited

U.S. PATENT DOCUMENTS

| | | | | |
|---|---|---|---|---|
| 276,365 | A * | 4/1883 | Curran | A23N 4/04 99/556 |
| 8,426,302 | B2 * | 4/2013 | Matsushita | H01L 21/02238 438/591 |
| 9,023,719 | B2 * | 5/2015 | Pachamuthu | H01L 27/11582 438/492 |
| 9,171,729 | B2 * | 10/2015 | You | H01L 29/40117 |
| 9,276,133 | B2 * | 3/2016 | Kim | H01L 27/11582 |
| 9,305,849 | B1 * | 4/2016 | Tsutsumi | H01L 21/8221 |
| 9,379,132 | B2 * | 6/2016 | Koka | H01L 27/11519 |
| 9,406,692 | B2 * | 8/2016 | Lee | H01L 27/11582 |
| 9,431,414 | B2 * | 8/2016 | Jang | H01L 27/1158 |
| 9,460,931 | B2 | 10/2016 | Pachamuthu et al. | |
| 9,524,755 | B1 * | 12/2016 | Naito | G11C 16/0466 |
| 9,524,977 | B2 * | 12/2016 | Sharangpani | H01L 27/11524 |
| 9,960,182 | B2 | 5/2018 | Choi et al. | |
| 10,121,553 | B2 * | 11/2018 | Harari | G11C 11/5628 |
| 10,263,006 | B2 | 4/2019 | Kim et al. | |
| 2011/0186851 | A1 * | 8/2011 | Son | H01L 27/11582 257/60 |
| 2011/0233648 | A1 * | 9/2011 | Seol | H01L 29/42348 257/324 |
| 2012/0001345 | A1 * | 1/2012 | Park | H01L 27/11578 257/774 |
| 2014/0070302 | A1 | 3/2014 | Yoo et al. | |
| 2015/0187791 | A1 | 7/2015 | Lee et al. | |
| 2015/0380418 | A1 * | 12/2015 | Zhang | H01L 27/11529 257/326 |
| 2016/0005759 | A1 * | 1/2016 | Kim | H01L 27/11556 257/314 |
| 2016/0181271 | A1 * | 6/2016 | Yada | H01L 27/1157 438/264 |
| 2016/0276353 | A1 | 9/2016 | Kobayashi et al. | |
| 2016/0276365 | A1 * | 9/2016 | Choi | H01L 27/1157 |
| 2017/0062330 | A1 | 3/2017 | Kim et al. | |
| 2017/0084696 | A1 * | 3/2017 | Lee | H01L 27/11565 |
| 2017/0263635 | A1 * | 9/2017 | Hamada | H01L 27/11582 |
| 2018/0315770 | A1 * | 11/2018 | Choi | H01L 21/02532 |

FOREIGN PATENT DOCUMENTS

| | | |
|---|---|---|
| KR | 10-2016-0112074 A | 9/2016 |
| KR | 10-2017-0036878 A | 4/2017 |
| KR | 10-2017-0042453 A | 4/2017 |

\* cited by examiner

SEMICONDUCTOR DEVICE AND METHOD OF FABRICATING THE SAME

CROSS-REFERENCE TO RELATED APPLICATIONS

This U.S. non-provisional patent application is a divisional of U.S. application Ser. No. 15/864,410, filed on Jan. 8, 2018, which claims priority under 35 U.S.C. § 119 to Korean Patent Application No. 10-2017-0055497, filed on Apr. 28, 2017, in the Korean Intellectual Property Office, the entire contents of each of which are hereby incorporated by reference.

BACKGROUND OF THE INVENTION

The disclosure relates to a semiconductor device and a method of fabricating the same, and in particular, to a three-dimensional semiconductor memory device and a method of fabricating the same.

Higher integration of semiconductor devices is desired to satisfy consumer demands for performance and price. In the case of semiconductor memory devices, since integration is an important factor in determining product prices, increased integration is especially desirable. In the case of two-dimensional or planar semiconductor memory devices, since their integration is mainly determined by the area occupied by a unit memory cell, integration may be greatly influenced by the level of a fine pattern forming technology. However, the expensive process equipment needed to increase pattern fineness may set a practical limitation on increasing integration for two-dimensional or planar semiconductor memory devices.

To overcome such a limitation, three-dimensional memory devices (for example, including three-dimensionally arranged memory cells) have been proposed. In the case of the three-dimensional memory device, not only memory cells but also signal or interconnection lines (e.g., word lines or bit lines) for the access to the memory cells may be arranged three-dimensionally.

SUMMARY

Some example embodiments of inventive concepts provide a memory device with improved reliability.

Some example embodiments of inventive concepts provide a method of fabricating a memory device with improved reliability.

According to some example embodiments of inventive concepts, a semiconductor device may include a substrate, an electrode structure including electrodes stacked on the substrate, an upper semiconductor pattern penetrating at least a portion of the electrode structure, and a lower semiconductor pattern between the substrate and the upper semiconductor pattern. The upper semiconductor pattern includes a gap-filling portion and a sidewall portion extending from the gap-filling portion in a direction away from the substrate, the lower semiconductor pattern includes a concave top surface, the gap-filling portion fills a region enclosed by the concave top surface, a top surface of the gap-filling portion has a rounded shape that is deformed toward the substrate, and a thickness of the sidewall portion is less than a thickness of the gap-filling portion According to some example embodiments of inventive concepts, a method of fabricating a semiconductor device may include forming a mold structure on a substrate, the mold structure comprising sacrificial layers and insulating layers that are alternatingly stacked on the substrate, forming a through hole which penetrates the mold structure, forming a lower semiconductor pattern having a concave top surface, in a lower region of the through hole, and forming an upper semiconductor pattern on the lower semiconductor pattern. The forming of the upper semiconductor pattern includes forming a second semiconductor layer to fill at least a portion of the through hole, performing a first etching process, after the forming of the second semiconductor layer, performing a thermal treatment process, after the first etching process, and performing a second etching process, after the thermal treatment process.

According to some example embodiments of inventive concepts, a semiconductor device may include a substrate, an electrode structure including electrodes stacked on the substrate, and a semiconductor pattern penetrating the electrode structure. The semiconductor pattern includes a gap-filling portion and a sidewall portion, the sidewall portion extending from the gap-filling portion in a direction away from the substrate, a top surface of the gap-filling portion has a rounded shape that is deformed toward the substrate, a bottom surface of the gap-filling portion is disposed below a topmost surface of the substrate, and a thickness of the sidewall portion is less than a thickness of the gap-filling portion.

BRIEF DESCRIPTION OF THE DRAWINGS

Example embodiments will be more clearly understood from the following brief description taken in conjunction with the accompanying drawings. The accompanying drawings represent non-limiting, example embodiments as described herein.

It should be noted that these figures are intended to illustrate the general characteristics of methods, structure and/or materials utilized in certain example embodiments and to supplement the written description provided below. These drawings are not, however, to scale and may not precisely reflect the precise structural or performance characteristics of any given embodiment, and should not be interpreted as defining or limiting the range of values or properties encompassed by example embodiments. For example, the relative thicknesses and positioning of molecules, layers, regions and/or structural elements may be reduced or exaggerated for clarity. The use of similar or identical reference numbers in the various drawings is intended to indicate the presence of a similar or identical element or feature.

DETAILED DESCRIPTION

Example embodiments of inventive concepts will now be described more fully with reference to the accompanying drawings, in which example embodiments are shown.

Figure 1:
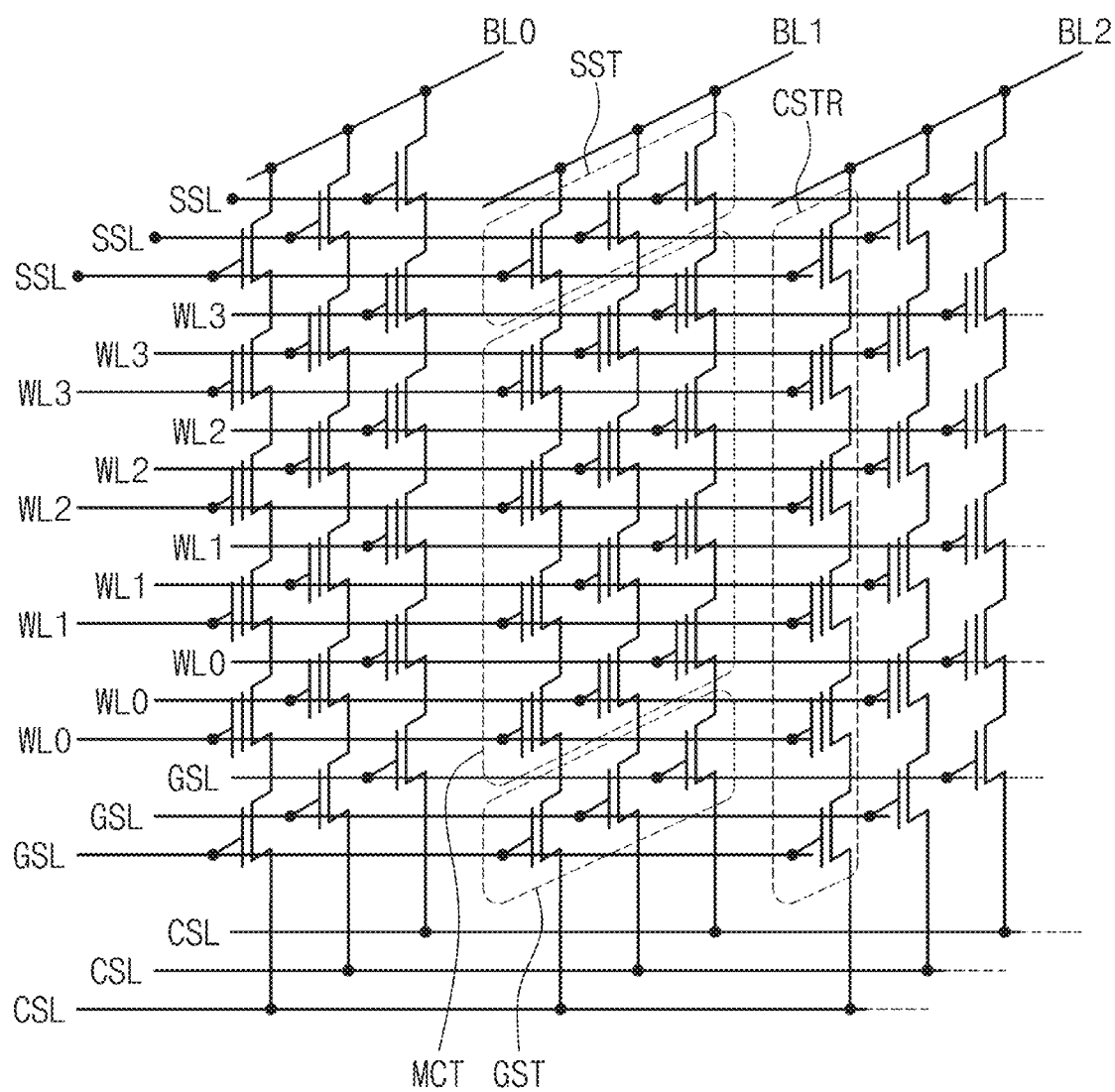
FIG. 1 is a circuit diagram of a cell array of a semiconductor device according to some example embodiments of inventive concepts.

FIG. 1 is a circuit diagram illustrating a cell array of a semiconductor memory device according to some example embodiments of inventive concepts. Referring to FIG. 1, a semiconductor memory device may include a common source line CSL, a plurality of bit lines BL0, BL1, and BL2, and a plurality of cell strings CSTR provided between the common source line CSL and the bit lines BL0-BL2.

The common source line CSL may be or may include a conductive layer provided on a substrate (e.g., a semiconductor substrate) or an impurity region formed in the substrate. The bit lines BL0-BL2 may be or may include conductive patterns (e.g., metal lines), which are provided on and spaced apart from the substrate. The bit lines BL0-BL2 may be two-dimensionally arranged on the substrate, and the plurality of cell strings CSTR may be electrically connected in parallel to each of the bit lines BL0-BL2. Accordingly, the cell strings CSTR may also be two-dimensionally arranged on the common source line CSL or the substrate.

Each of the cell strings CSTR may be configured to include a ground selection transistor GST connected to the common source line CSL, a string selection transistor SST connected to one of the bit lines BL0-BL2, and a plurality of memory cell transistors MCT provided between the ground and string selection transistors GST and SST. The ground selection transistor GST, the memory cell transistors MCT, and the string selection transistor SST constituting each of the cell strings CSTR may be connected in series. Furthermore, a ground selection line GSL, a plurality of word lines WL0-WL3, and a plurality of string selection lines SSL0-SSL2 may be provided between the common source line CSL and the bit lines BL0-BL2 and may be used as gate electrodes of the ground selection transistor GST, the memory cell transistors MCT, and the string selection transistors SST, respectively.

The ground selection transistors GST may be arranged at the same or substantially same height, when measured from the substrate, and the gate electrodes thereof may be connected in common to the ground selection line GSL, thereby being in an equipotential state. For example, the ground selection line GSL may be a plate- or comb-shaped conductive pattern which is located between the common source line CSL and the lowermost one of the memory cell transistors MCT most adjacent thereto. Similarly, the gate electrodes of the memory cell transistors MCT, which are located at the same height from the common source line CSL, may also be connected in common to one of the word lines WL0-WL3, thereby being in an equipotential state. For example, each of the word lines WL0 to WL3 may be a plate- or comb-shaped conductive pattern which is parallel with an upper, or a top surface of the substrate. Since each of the cell strings CSTR includes a plurality of the memory cell transistors MCT located at different heights, the word lines WL0-WL3 may be provided to have a multi-layered structure between the common source line CSL and the bit lines BL0-BL2.

In addition, each of the cell strings CSTR may include a channel structure that vertically extends from the common source line CSL and is connected to a corresponding one of the bit lines BL0-BL2. The channel structures may be formed to penetrate the ground selection line GSL and the word lines WL0-WL3. Furthermore, each of the channel structures may include a body portion and an impurity region, which is formed in one or both of ends of the body portion. For example, a drain region may be formed in a top portion of the channel structure.

A memory layer may be provided between the word lines WL0-WL3 and the channel structure. In some example embodiments, the memory layer may be or include a charge storing layer.

A dielectric layer may be provided between the ground or string selection line GSL or SSL and the channel structure and may be used as a gate insulating layer of the ground or string selection transistor GST or SST. At least one of the gate insulation layers of the ground and string selection transistors GST and SST may be formed of the same material as the memory layer of the memory cell transistors MCT, but, in certain embodiments, at least one of the gate insulating layers of the ground and string selection transistors GST and SST may be formed of a gate dielectric material (e.g., a silicon oxides layer) commonly used in metal-oxide-semiconductor field effect transistors (MOSFETs).

The ground and string selection transistors GST and SST and the memory cell transistors MCT may be or may include metal-oxide-semiconductor field effect transistors (MOSFETs), in which the channel structures are used as channel regions. In certain embodiments, the channel structure, in conjunction with the ground selection line GSL, the word lines WL0-WL3, and the string selection lines SSL, may include metal-oxide-semiconductor (MOS) capacitors. In this case, if a voltage higher than a threshold voltage of the MOS capacitor is applied to the ground selection line GSL, the word lines WL0-WL3, and the string selection lines SSL, a fringe field may be produced to form an inversion layer between the word lines WL0 to WL3, and the formation of the inversion layer may allow the ground selection transistor GST, the memory cell transistors MCT, and the string selection transistor SST to be electrically connected to each other.

Figure 2:
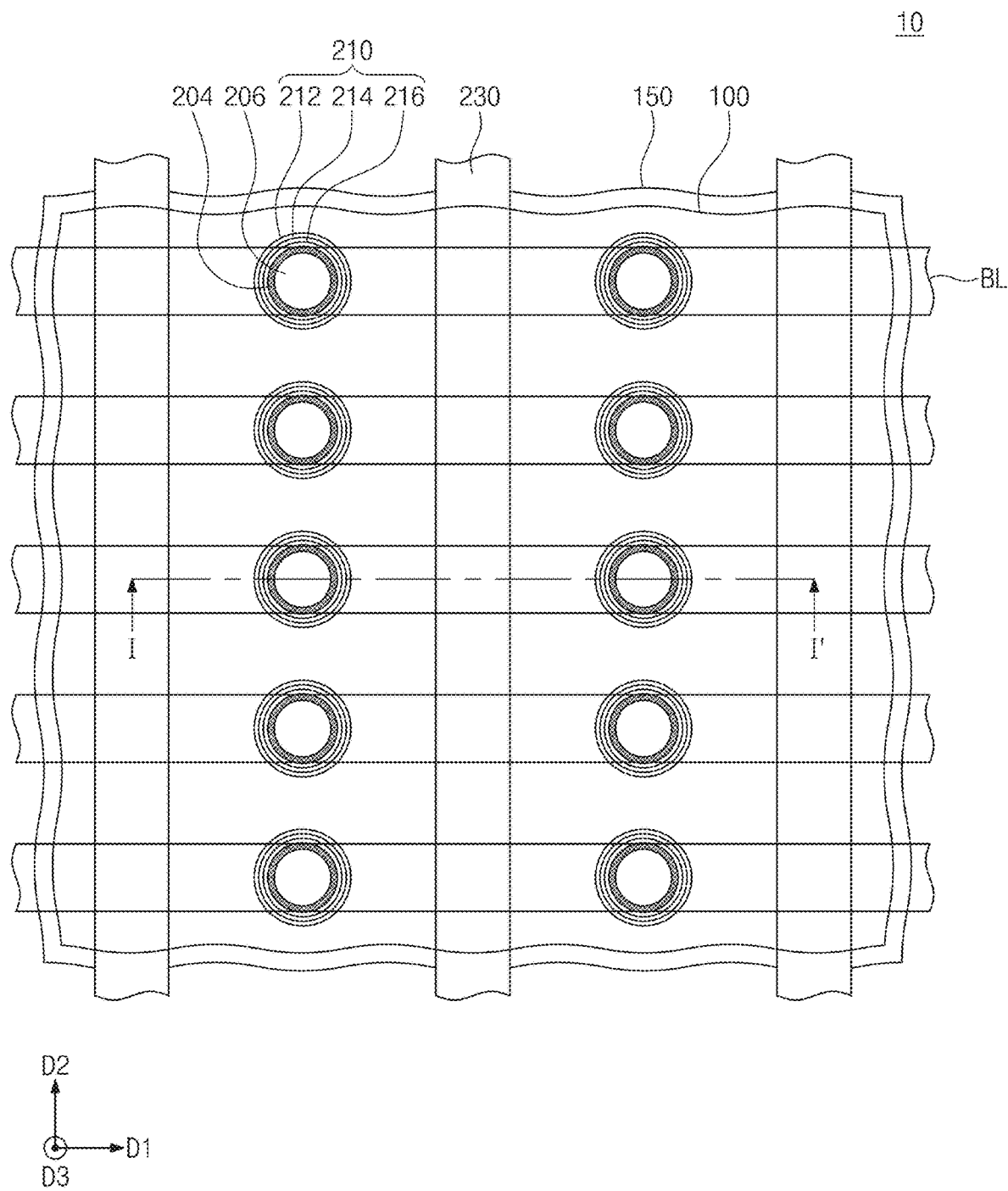
FIG. 2 is a plan view of a semiconductor device according to some example embodiments of inventive concepts.
Figure 3:
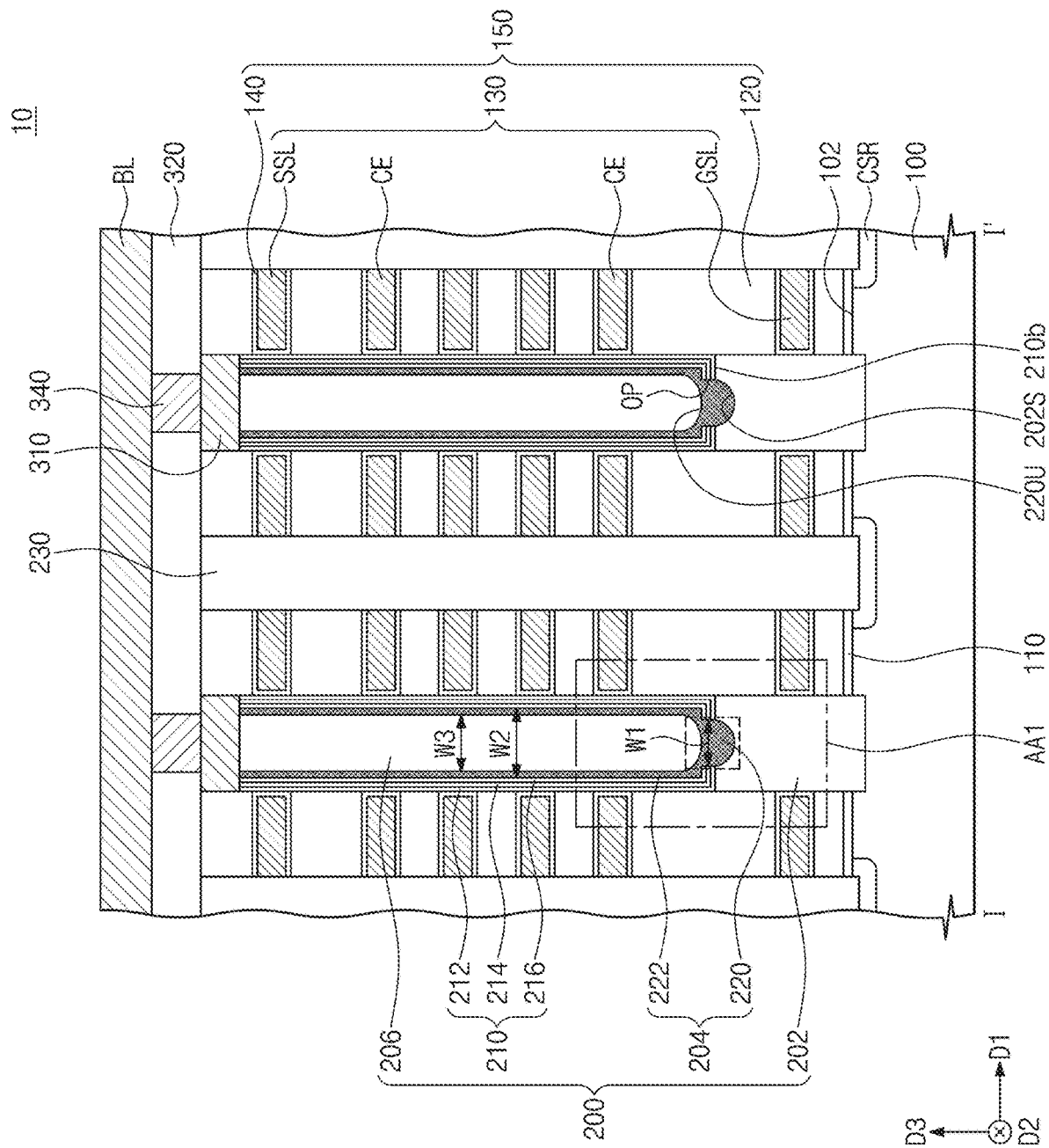
FIG. 3 is a sectional view taken along line I-I' of FIG. 2.
Figure 4:
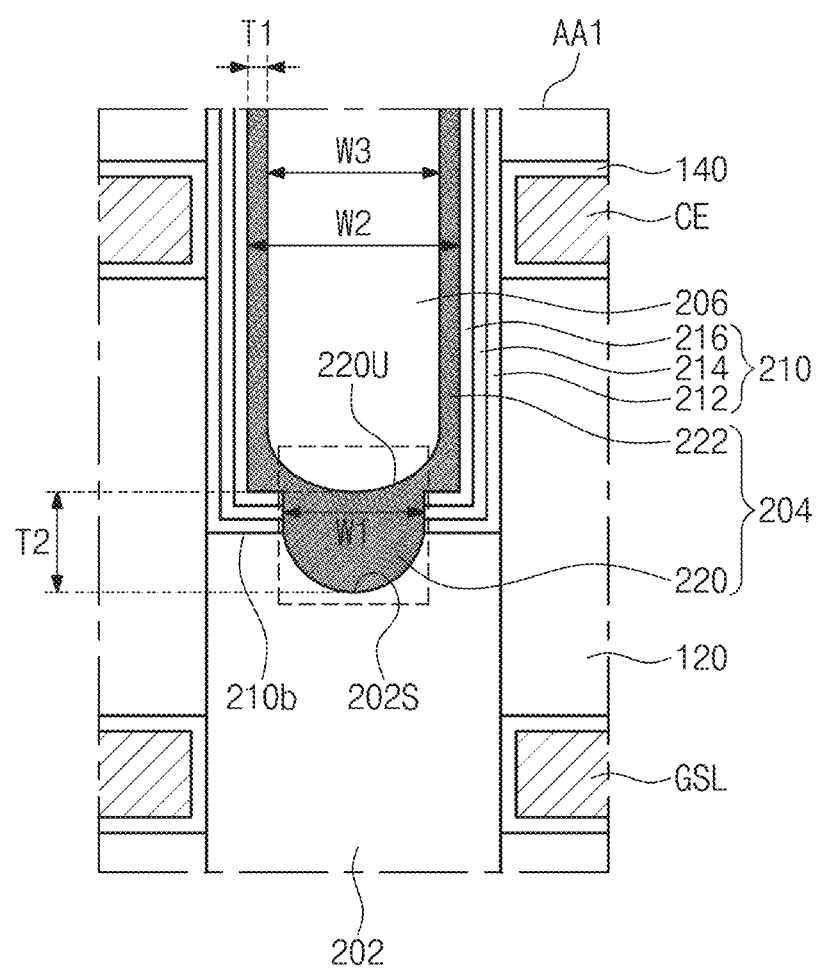
FIG. 4 is an enlarged view illustrating a portion 'AA1' of FIG. 3.

FIG. 2 is a plan view of a semiconductor device according to some example embodiments of inventive concepts. FIG. 3 is a sectional view taken along line I-I' of FIG. 2. FIG. 4 is an enlarged view illustrating a portion 'AA1' of FIG. 3.

Referring to FIGS. 2 and 3, a semiconductor device 10 with a substrate 100 may be provided. The substrate 100 may be or may include a semiconductor substrate (e.g., a silicon wafer, a germanium wafer, or a silicon-germanium wafer). The substrate 100 may be a semiconductor substrate, which is formed of or includes an intrinsic semiconductor material or is doped to have a first conductivity type (e.g., p type).

Common source regions CSR may be provided on the substrate 100. The common source regions CSR may be arranged in a first direction D1 that is parallel to a top surface 102 of the substrate 100. The common source regions CSR may extend in a second direction D2 that is parallel to the top surface 102 of the substrate 100 but is not parallel to the first direction D1. In the case where the substrate 100 has the first conductivity type, the common source region CSR may have a second conductivity type (e.g., n type) different from the first conductivity type.

Electrode structures 150 may be provided on the substrate 100. The electrode structures 150 may be arranged in the first direction D1 and may extend in the second direction D2. In some example embodiments, adjacent ones of the electrode structures 150 may be provided at both sides of the common source region CSR in the first direction D1.

Each of the electrode structures 150 may include electrodes 130 stacked, e.g. sequentially stacked on the substrate 100, insulating patterns 120 between the electrodes 130, and a horizontal insulating layer 140 between the electrodes 130 and the insulating patterns 120. The electrodes 130 and the insulating patterns 120 may be alternatingly stacked on the substrate 100. The electrodes 130 may be electrically disconnected from each other by the insulating patterns 120.

The electrodes 130 may include the ground selection line GSL, the string selection line SSL, and cell electrodes CE between the ground and string selection lines GSL and SSL. The ground selection line GSL may be or may include the lowermost one of the electrodes 130. The string selection line SSL may be or may include the uppermost one of the electrodes 130. The cell electrodes CE may be provided between the ground selection line GSL and the string selection line SSL and may be stacked in a third direction D3 which is perpendicular or substantially perpendicular to the top surface 102 of the substrate 100. The ground selection line GSL, the string selection line SSL, and the cell electrodes CE may not be limited to the example shown in FIGS. 2 to 4. The electrodes 130 may be formed of or include at least one of conductive materials (e.g., metals, doped semiconductor materials, conductive metal nitrides, transition metals, or combinations thereof).

Thicknesses of the insulating patterns 120 may be changed as occasion demands. For example, a thickness of the insulating pattern 120 between the ground selection line GSL and the cell electrode CE adjacent thereto may be greater than a thickness of each of the insulating patterns 120 between the cell electrodes CE.

The horizontal insulating layer 140 may include a portion that is between the electrodes 130 and vertical patterns 200 to be described below. The horizontal insulating layer 140 may have a single or multi-layered structure. In some example embodiments, the horizontal insulating layer 140 may be formed of or include silicon oxide.

Each of the electrode structures 150 may further include a buffer insulating layer 110 provided below the ground selection line GSL. The buffer insulating layer 110 may be formed of or include an insulating material (e.g., silicon oxide).

The vertical patterns 200 may be on the substrate 100. The vertical patterns 200 may penetrate the electrode structures 150 respectively and thereby to be in contact with the substrate 100. An aspect ratio of the vertical patterns 200 may be greater than or equal to 3:1, for example, the aspect ratio of the vertical patterns 200 may be greater than or equal to 10:1. The vertical patterns 200 may extend in the third direction D3. Bottom surfaces of the vertical patterns 200 may be in contact with the top surface 102 of the substrate 100. As shown in the drawings, each of the vertical patterns 200 may have a constant width, but inventive concepts are not limited thereto. In certain embodiments, the width of each of the vertical patterns 200 may decrease with decreasing distance from the substrate 100. The vertical patterns 200 in each of the electrode structures 150 may be arranged in the second direction D2. However, the arrangement of the vertical patterns 200 may be variously changed. For example, the vertical patterns 200 in the second direction D2 may be arranged in a zigzag manner.

Each of the vertical patterns 200 may include a lower semiconductor pattern 202, an upper semiconductor pattern 204 provided on the lower semiconductor pattern 202, a vertical insulating pattern 210 between the upper semiconductor pattern 204 and the electrode structure 150, and an insulating filling pattern 206 filling an inner space of the upper semiconductor pattern 204.

The lower semiconductor pattern 202 may extend from the top surface 102 of the substrate 100 in the third direction D3. The lower semiconductor pattern 202 may horizontally overlap with the ground selection line GSL; for example, the lower semiconductor pattern 202 may have a portion located at the same level as the ground selection line GSL. A top surface of the lower semiconductor pattern 202 may be between the ground selection line GSL and the cell electrode CE adjacent thereto, when measured from the substrate 100. The top surface of the lower semiconductor pattern 202 may include a concave top surface 202S. For example, the concave top surface 202S may be a rounded surface that is concavely recessed toward the substrate 100. The lower semiconductor pattern 202 may be formed of or include at least one of poly silicon, single crystalline silicon, or amorphous silicon. The lower semiconductor pattern 202 may be intrinsic or have the same conductivity type as the substrate 100.

The vertical insulating pattern 210 may be provided on the lower semiconductor pattern 202. The vertical insulating pattern 210 may extend from the top surface of the lower semiconductor pattern 202 in the third direction D3. The vertical insulating pattern 210 may have a macaroni shape or a hollow pipe shape. A bottom surface 210b of the vertical insulating pattern 210 may be positioned between the ground selection line GSL and the lowermost one of the cell electrodes CE.

An opening OP may be formed through a bottom portion of the vertical insulating pattern 210. A distance between inner side surfaces of the vertical insulating pattern 210 exposed by the opening OP (e.g., a diameter of the opening OP) may be smaller than a third diameter W3 to be described below. The opening OP may expose the concave top surface 202S of the lower semiconductor pattern 202. When viewed in a plan view, the diameter of the opening OP may be the same as or substantially the same as a diameter of the concave top surface 202S. But inventive concepts are not limited thereto, and in certain embodiments, the diameter of the opening OP may be different from that of the concave top surface 202S.

The vertical insulating pattern 210 may include a blocking insulating pattern 212, a charge storing pattern 214, and a tunnel insulating pattern 216. The blocking insulating pattern 212 may cover an inner surface of each of the electrode structures 150 and may be adjacent to the cell electrodes CE, when compared with the charge storing pattern 214 and the tunnel insulating pattern 216. The tunnel insulating pattern 216 may be spaced apart from an inner surface of each of the electrode structures 150 with the blocking insulating pattern 212 therebetween. For example, the tunnel insulating pattern 216 may be spaced apart from the cell electrodes CE by the blocking insulating pattern 212. The charge storing pattern 214 may be provided between the blocking insulating pattern 212 and the tunnel insulating pattern 216. In some example embodiments, the tunnel insulating pattern 216 may be formed of or include at least one of silicon oxide or silicon oxynitride. The charge storing pattern 214 may be formed of or include a silicon nitride layer with trap sites, an insulating layer with conductive nanodots, or combinations thereof. The blocking insulating pattern 212 may be formed of or include at least one of high-k dielectric materials whose dielectric constants are higher than that of the tunnel insulating pattern 216. In certain example embodiments, the blocking insulating pattern 212 may further include a barrier insulating layer (e.g., a silicon oxide layer) whose energy band gap is larger than the high-k dielectric materials.

The upper semiconductor pattern 204 may be on the lower semiconductor pattern 202. The upper semiconductor pattern 204 may extend along an inner side surface of the vertical insulating pattern 210 and may cover the concave top surface 202S of the lower semiconductor pattern 202. The upper semiconductor pattern 204 may be a macaroni- or pipe-shape with closed bottom; however, inventive concepts are not limited thereto and may be variously changed.

The upper semiconductor pattern 204 may fill a gap region that is defined or enclosed by the opening OP and the concave top surface 202S. Hereinafter, a portion of the upper semiconductor pattern 204 enclosed by the opening OP and the concave top surface 202S will be referred to as a gap-filling portion 220, and another portion extending form the gap-filling portion in the third direction will be referred to as a sidewall portion 222. The gap-filling portion 220 may be between the ground selection line GSL and the lowermost one of the cell electrodes CE.

The gap-filling portion 220 may have a thickness T2 that is greater than a thickness T1 of the sidewall portion 222. The thickness T2 of the gap-filling portion 220 may be a distance between bottom and top surfaces of the gap-filling portion 220 measured in the third direction D3. The thickness of the sidewall portion 222 may be a distance between outer and inner side surfaces of the sidewall portion 222 measured in the first direction D1.

A first diameter W1 of the gap-filling portion 220 may be the same as or substantially the same as a diameter of the opening OP. The first diameter W1 of the gap-filling portion 220 may be less than an outer diameter (hereinafter, a second diameter W2) of the sidewall portion 222. In some example embodiments, the first diameter W1 of the gap-filling portion 220 may be less than or equal to an inner diameter (hereinafter, a third diameter W3) of the sidewall portion 222.

The gap-filling portion 220 may include a lower portion that protrudes or extends in a direction from the bottom surface 210b of the vertical insulating pattern 210 toward the substrate 100. Thus, the top surface 102 of the substrate 100 may be closer to a bottom surface of the gap-filling portion 220 than to the bottom surface 210b of the vertical insulating pattern 210.

The bottom surface of the gap-filling portion 220 may be or may include a convex surface corresponding to the concave top surface 202S of the lower semiconductor pattern 202. For example, the bottom surface of the gap-filling portion 220 may be convexly rounded toward the lower semiconductor pattern 202. In some example embodiments, a curvature of the bottom surface of the gap-filling portion 220 may be greater than a curvature of the top surface of the gap-filling portion 220. In certain example embodiments, the curvature of the bottom surface of the gap-filling portion 220 may be less than that of a top surface 220U of the upper semiconductor pattern 204. Although a solid line is used to illustrate a boundary between the gap-filling portion 220 and the lower semiconductor pattern 202, the gap-filling portion 220 and the lower semiconductor pattern 202 may be continuously connected to each other in view of crystallography. For example, the gap-filling portion 220 and the lower semiconductor pattern 202 may be a single structure without any internal boundary.

The top surface 220U of the gap-filling portion 220 may be curvedly connected to the inner side surface of the sidewall portion 222; however, inventive concepts are not limited thereto. For example, the top surface 220U of the gap-filling portion 220 may be a generally concave top surface. As an example, the top surface 220U of the gap-filling portion 220 may have a rounded shape that is concavely deformed toward the substrate 100. A slope of the top surface 220U may increase with increasing distance from a center of the top surface 220U; for example, the slope of the top surface 220U of the gap-filling portion 220 may be gentle near a center thereof and steep at an edge thereof.

Generally, the upper semiconductor pattern 204 may conformally cover an inner side surface of the vertical insulating pattern 210 exposed by the opening OP. In this case, during an etching process for thinning the upper semiconductor pattern 204, a portion of the upper semiconductor pattern 204 may be excessively etched at a region adjacent to the opening OP. For example, at the region adjacent to the opening OP, the upper semiconductor pattern 204 may have a cut shape. This may lead to deterioration in electric characteristics of the upper semiconductor pattern 204 and consequent deterioration in reliability characteristics of the semiconductor device.

According to some example embodiments of inventive concepts, at the region adjacent to the opening OP, the upper semiconductor pattern 204 may have a continuous structure without any cut portion. Thus, preventing, or reducing the likelihood of electric characteristics of the semiconductor device 10 from being deteriorated, may be possible. Accordingly, improving reliability of the semiconductor device 10 may be possible.

The position of the top surface 220U of the gap-filling portion 220 is not limited to the example illustrated in FIG. 4. For example, the top surface 220U of the gap-filling portion 220 may be positioned at a height lower than that illustrated in FIG. 4. For example, the top surface 220U of the gap-filling portion 220 may be positioned in the opening OP. In some example embodiments, the top surface 220U of the gap-filling portion 220 may be positioned at a height higher than that illustrated in FIG. 4. Nevertheless, the top surface 220U of the gap-filling portion 220 may be positioned at a height lower than that of a bottom surface of the lowermost one of the cell electrodes CE.

In some example embodiments, the upper semiconductor pattern 204 may be formed of or include at least one of poly silicon or single crystalline silicon. The upper semiconductor pattern 204 may be intrinsic or may have the same conductivity type as the substrate 100.

The insulating filling pattern 206 may be provided in the upper semiconductor pattern 204. The insulating filling pattern 206 may fill a gap region enclosing an inner side surface of the sidewall portion 222 and the top surface 220U of the gap-filling portion 220. In some example embodiments, the insulating filling pattern 206 may be formed of or include silicon oxide.

Conductive pads 310 may be provided on the vertical patterns 200, respectively. The conductive pads 310 may cover top surfaces of the vertical patterns 200. The conductive pads 310 may be vertically (i.e., when viewed in a plan view) overlapped with the vertical patterns 200. The conductive pads 310 may be formed of or include at least one of conductive materials (e.g., metals, doped semiconductor materials, conductive metal nitrides, transition metals, or combinations thereof).

Electrode separation patterns 230 may be provided at both sides of each of the electrode structures 150. The electrode separation patterns 230 may be provided to cover the common source regions CSR, respectively. In some example embodiments, the electrode separation patterns 230 may be formed of or include at least one of silicon oxide, silicon nitride, or silicon oxynitride.

An interlayered insulating layer 320 may be provided on the electrode structures 150. The interlayered insulating layer 320 may be provided to cover top surfaces of the electrode structures 150, top surfaces of the conductive pads 310, and top surfaces of the electrode separation patterns 230. In some example embodiments, the interlayered insulating layer 320 may be formed of or include at least one of silicon oxide or silicon nitride.

Bit line contact plugs 340 may be provided on the conductive pads 310, respectively. The bit line contact plugs 340 may penetrate the interlayered insulating layer 320 and may be connected to the conductive pads 310, respectively. For example, a bottom surface of the bit line contact plug 340 may be in direct contact with the top surface of a corresponding one of the conductive pad 310. The bit line contact plug 340 may be formed of or include at least one of conductive materials (e.g., metals, doped semiconductor materials, conductive metal nitrides, transition metals, or combinations thereof).

Bit lines BL may be provided on the bit line contact plugs 340 and the interlayered insulating layer 320. The bit lines BL may extend in the first direction D1. The bit lines BL may be arranged in the second direction D2. Each of the bit lines BL may be electrically connected to the upper semiconductor pattern 204 through the conductive pad 310 and the bit line contact plug 340.

According to some example embodiments of inventive concepts, the upper semiconductor pattern 204 may be prevented from, or reduced in likelihood of occurrence of, being excessively etched at a region adjacent to the opening OP. Accordingly, preventing, or reducing the likelihood of occurrence of, electric characteristics of the semiconductor device 10 from being deteriorated may be possible. Accordingly, improving reliability of the semiconductor device 10 may be possible.

A method of fabricating the semiconductor device 10 will be described in more detail below.

FIGS. 5 to 8 are sectional views, which are taken to correspond to the line I-I' of FIG. 2 and to illustrate a method of fabricating a semiconductor device according to some example embodiments of inventive concepts.

Figure 5:
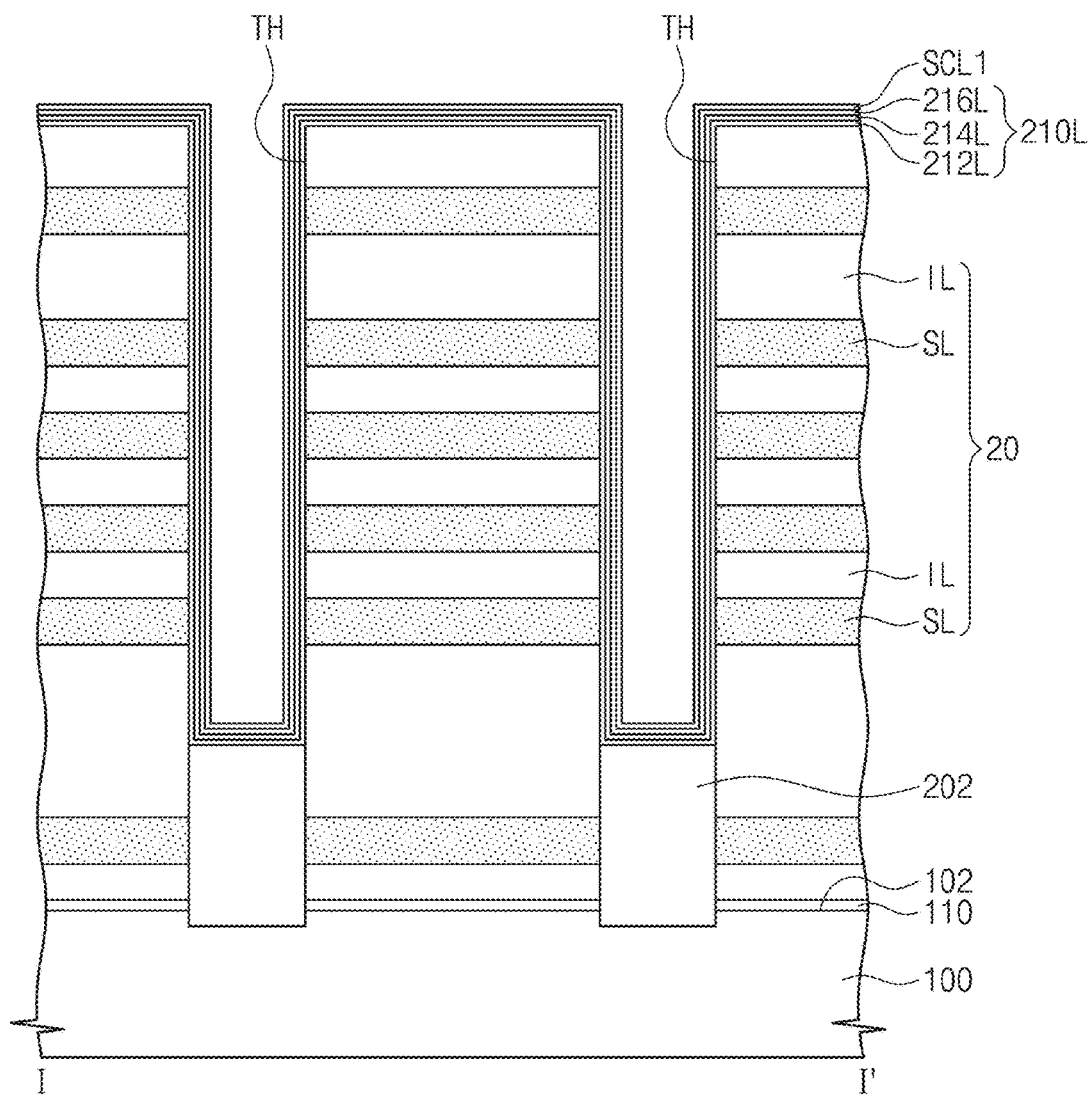
FIGS. 5 to 8 are sectional views, which are taken to correspond to the line I-I' of FIG. 2 and to illustrate a method of fabricating a semiconductor device according to some example embodiments of inventive concepts.
Figure 5:
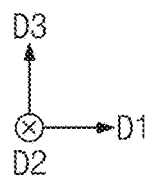

Referring to FIGS. 2 and 5, the buffer insulating layer 110 and a mold structure 20 may be formed on the substrate 100. In some example embodiments, the buffer insulating layer 110 may be or may include a silicon oxide layer that is formed by a thermal oxidation process or by a deposition technique or process.

The mold structure 20 may include sacrificial layers SL and insulating layers IL. The insulating layers IL may be stacked on the buffer insulating layer 110 in the third direction D3. The sacrificial layers SL may be stacked between the insulating layers IL. For example, the sacrificial layers SL and the insulating layers IL may be alternatingly stacked on the substrate 100. For example, the sacrificial layers SL and the insulating layers IL may be formed by a thermal chemical vapor deposition (CVD) process, a plasma-enhanced CVD process, a physical CVD process, and/or an atomic layer deposition (ALD) process. The sacrificial layers SL may be formed of or include a material having an etch selectivity with respect to the buffer insulating layer 110 and the insulating layers IL. For example, the sacrificial layers SL may be formed of or include at least one of silicon, silicon oxide, silicon carbide, silicon oxynitride, or silicon nitride. For example, the insulating layers IL may be formed of a material, which is selected from the group including or consisting of silicon, silicon oxide, silicon carbide, silicon oxynitride, and silicon nitride, but is different from that of the sacrificial layers SL. As an example, the sacrificial layers SL may be formed of silicon nitride, and the insulating layers IL may be formed of silicon oxide. However, in certain embodiments, the sacrificial layers SL may be formed of a conductive material, and the insulating layers IL may be formed of an insulating material.

Through holes TH may be formed in the mold structure 20. The formation of the through holes TH may include forming a mask pattern (not shown) on the mold structure 20 and sequentially etching the insulating layers IL, the sacrificial layers SL, and the buffer insulating layer 110 using the mask pattern (not shown) as an etch mask. The through holes TH may be formed exposing the substrate 100. An aspect ratio of the through-holes TH may be greater than or equal to 3:1, e.g. may be greater than or equal to 10:1. During the etching process, the top surface of the substrate 100 may be excessively etched. For example, the top surface of the substrate 100 may be recessed. The mask pattern may be removed, after the etching process.

Lower semiconductor patterns 202 may be formed in the through holes TH, respectively. The formation of the lower semiconductor patterns 202 may include performing a selective epitaxial growth process, in which the substrate 100 exposed by the through holes TH is used as a seed layer. Thus, the lower semiconductor patterns 202 may have the same conductivity type as the substrate 100. The lower semiconductor patterns 202 may be grown from the top surface 102 of the substrate 100, but the top surface thereof may be positioned between the lowermost and second lowermost ones of the sacrificial layers SL.

A blocking insulating layer 212L, a charge storing layer 214L, and a tunnel insulating layer 216L may be sequentially formed on the mold structure 20 and the lower semiconductor pattern 202. The formation of the blocking insulating layer 212L, the charge storing layer 214L, and the tunnel insulating layer 216L may include an atomic layer deposition (ALD) process and/or a chemical vapor deposition (CVD) process. The blocking insulating layer 212L may cover the side surfaces of the insulating and sacrificial layers IL and SL and the top surface of the lower semiconductor pattern 202 which are exposed by the through holes TH. In some example embodiments, the tunnel insulating layer 216L may be formed of or include at least one of silicon oxide or silicon oxynitride. In some example embodiments, the charge storing layer 214L may be formed of or include a silicon nitride layer with trap sites, an insulating layer with conductive nanodots, or combinations thereof. In some example embodiments, the blocking insulating layer 212L may be formed of or include at least one of high-k dielectric materials whose dielectric constants are greater than that of the tunnel insulating layer 216L. Hereinafter, the blocking insulating layer 212L, the charge storing layer 214L, and the tunnel insulating layer 216L will be referred to as a vertical insulating layer 210L.

A first semiconductor layer SCL1 may be formed on the tunnel insulating layer 216L. The formation of the first semiconductor layer SCL1 may include an atomic layer deposition (ALD) process or a chemical vapor deposition (CVD) process. In some example embodiments, the first semiconductor layer SCL1 may be formed of or include amorphous silicon. The first semiconductor layer SCL1 may prevent the tunnel insulating layer 216L, the charge storing layer 214L, and the blocking insulating layer 212L on an inner side surface of the mold structure 20 from being damaged in one or more subsequent etching processes.

Figure 6:
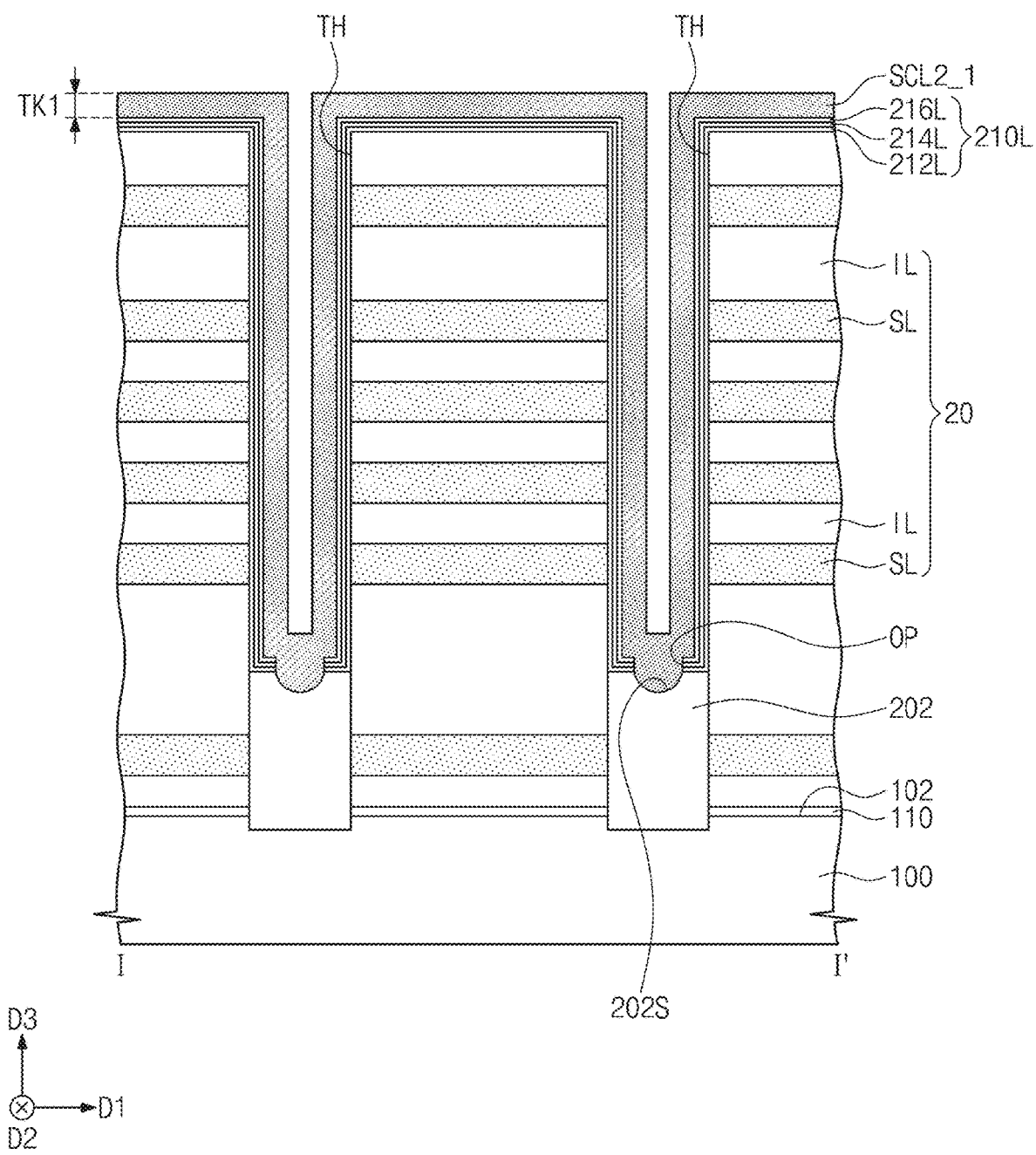

Referring to FIG. 6, the tunnel insulating layer 216L, the charge storing layer 214L, and the blocking insulating layer 212L may be etched, e.g. sequentially etched to form the opening OP. The formation of the opening OP may include sequentially and anisotropically etching the first semiconductor layer SCL1, the tunnel insulating layer 216L, the charge storing layer 214L, and the blocking insulating layer 212L, similar to described with reference to FIG. 5. The etching process may be performed to expose the top surface of the lower semiconductor pattern 202. The etching process may be performed leaving the first semiconductor layer SCL1, the tunnel insulating layer 216L, the charge storing layer 214L, and the blocking insulating layer 212L on the top surface of the mold structure 20.

After the anisotropic etching process, an upper portion of the lower semiconductor pattern 202 may be isotropically etched, and thus, the lower semiconductor pattern 202 may have the concave top surface 202S. The isotropic etching process may be performed through the opening OP. In certain embodiments, the first semiconductor layer SCL1 may be removed, during the isotropic etching process.

After the removal of the first semiconductor layer SCL1, a second semiconductor layer SCL2_1 may be formed on the tunnel insulating layer 216L. The formation of the second semiconductor layer SCL2_1 may include an atomic layer deposition (ALD) process and/or a chemical vapor deposition (CVD) process. In some example embodiments, the second semiconductor layer SCL2_1 may be or may include an amorphous silicon layer. The second semiconductor layer SCL2_1 may extend along an inner side surface of the tunnel insulating layer 216L and into the through holes TH. The second semiconductor layer SCL2_1 may have a first thickness TK1 that is greater than or equal to a radius of the opening OP. Thus, the second semiconductor layer SCL2_1 may fill a region enclosed by the opening OP and the concave top surface 202S of the lower semiconductor pattern 202. A thickness of the second semiconductor layer SCL2_1 may be greater on the top surface of the lower semiconductor pattern 202 than on the inner side surface of the tunnel insulating layer 216L. In a lower region of the through hole TH adjacent to the opening OP, a top surface of the second semiconductor layer SCL2_1 may be positioned at a height higher than that of the tunnel insulating layer 216L.

Figure 7:
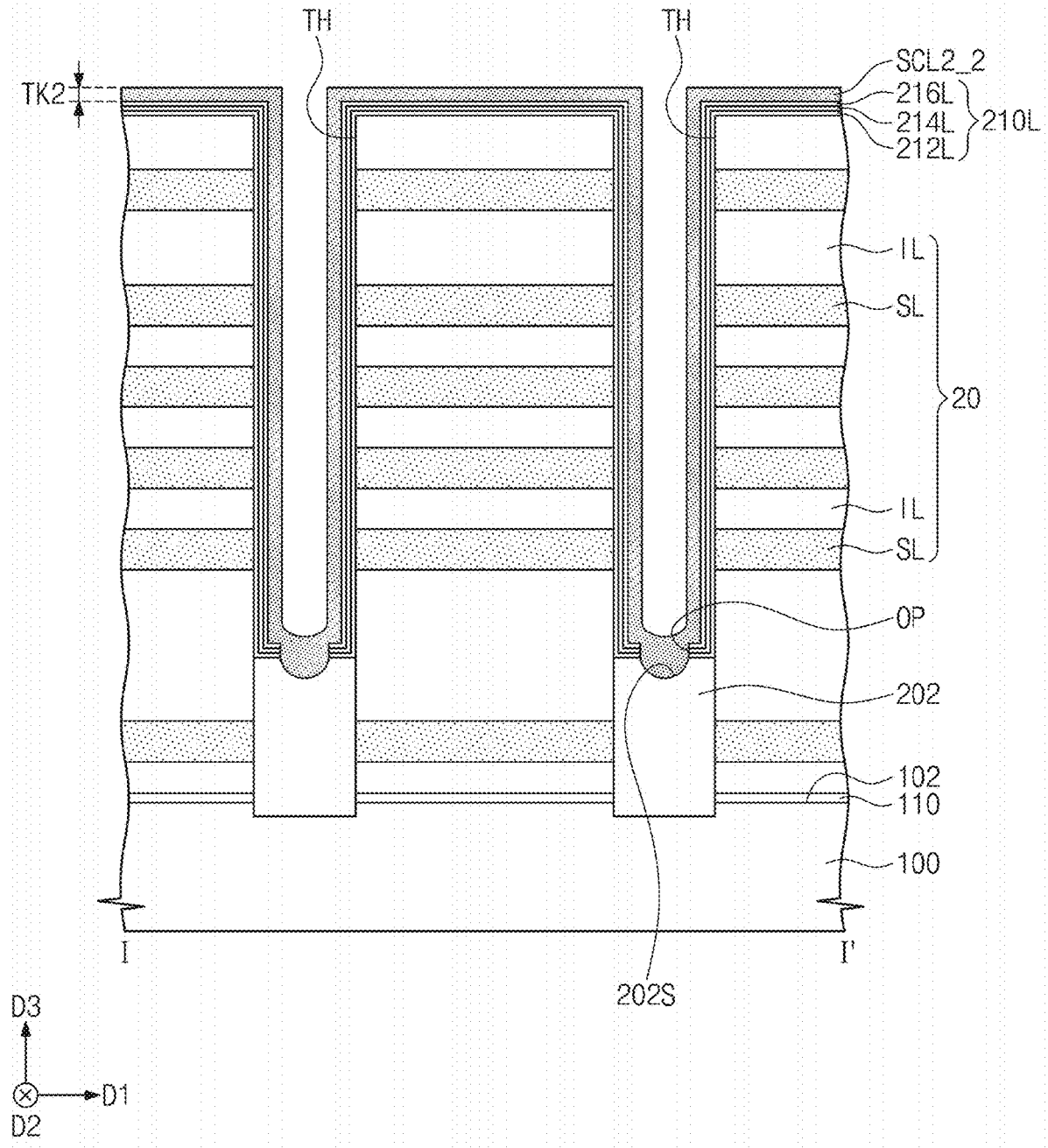

Referring to FIG. 7, a first isotropic etching process may be performed on the second semiconductor layer SCL2_1 to form a second semiconductor layer SCL2_2 that is thinner than the second semiconductor layer SCL2_1. In some example embodiments, the first isotropic etching process may be or may include an isotropic dry etching process. For example, the isotropic dry etching process may include a gas-phase etching process. The first isotropic dry etching process (e.g., the gas-phase etching process) may allow a target object to have a uniform thickness, after a process for etching the target object. For example, the second semiconductor layer SCL2_2 may have a uniform thickness. After the first isotropic etching process, the second semiconductor layer SCL2_2 may have a second thickness TK2 that is less than the first thickness TK1. If the second thickness TK2 is excessively small, the second semiconductor layer SCL2_2 may not be crystallized by a subsequent thermal treatment process to be performed on the second semiconductor layer SCL2_2. The second thickness TK2 may be greater than or equal to a crystallizable thickness of the second semiconductor layer SCL2_2 that can be achieved by the thermal treatment process.

A top surface of the second semiconductor layer SCL2_2 adjacent to the lower semiconductor pattern 202 may have a concaved shape by the etching process.

After the first isotropic etching process, a thermal treatment process may be performed on the second semiconductor layer SCL2_2. For example, the thermal treatment process may include a hydrogen annealing process that is performed under a hydrogen- or deuterium-containing gas atmosphere. The thermal treatment process may be performed to crystallize the second semiconductor layer SCL2_2. For example, the second semiconductor layer SCL2_2 may have an amorphous structure before the thermal treatment process and have a crystalline structure, e.g. a polycrystalline structure, after the thermal treatment process.

Figure 8:
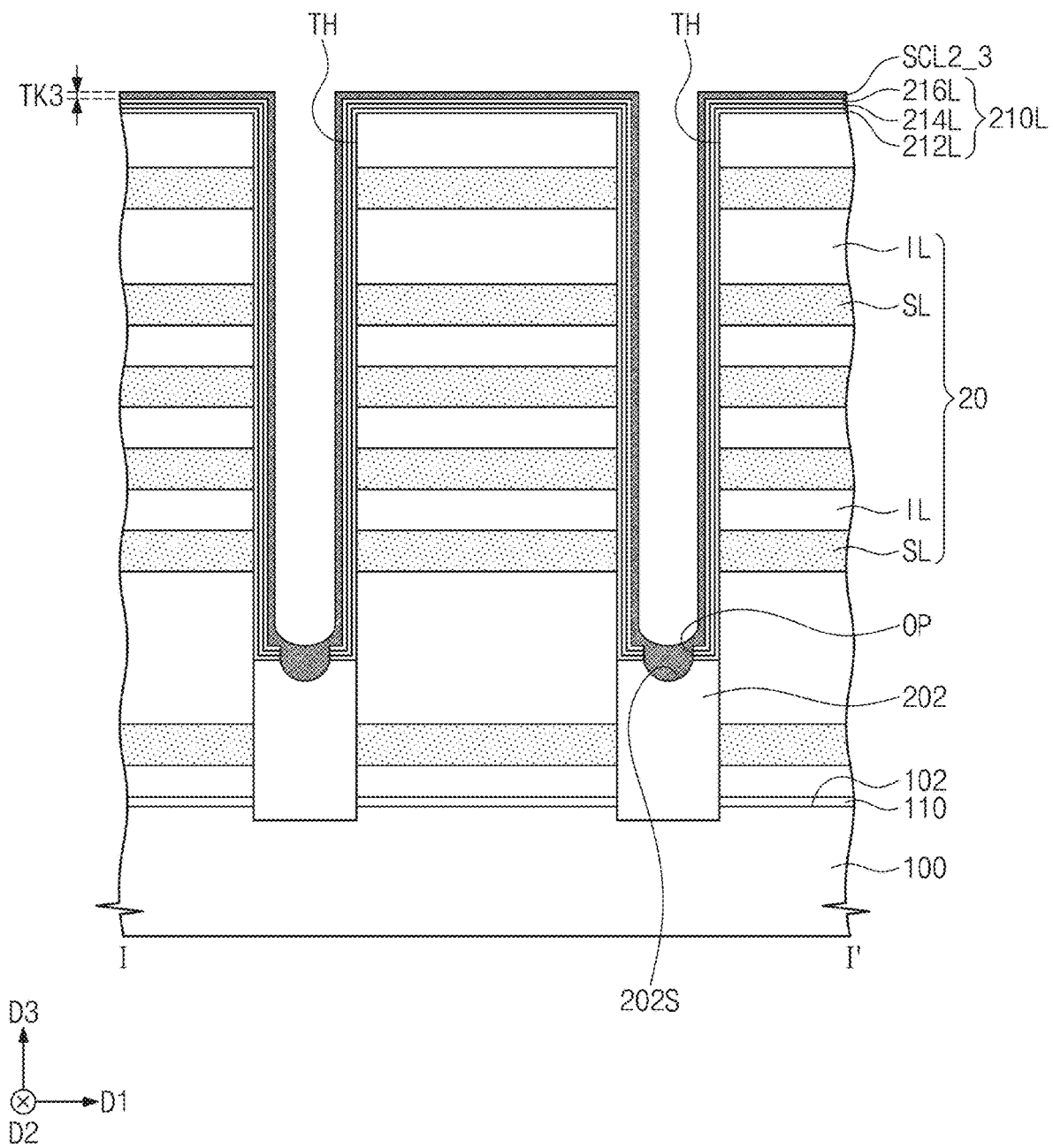

Referring to FIG. 8, after the thermal treatment process, a second isotropic etching process may be performed on the second semiconductor layer SCL2_2 to form a second semiconductor layer SCL2_3 with a further reduced thickness. In some example embodiments, the second isotropic etching process may be or may include an isotropic wet etching process. After the second isotropic etching process, the second semiconductor layer SCL2_3 may have a third thickness TK3 less than the second thickness TK2. The third thickness TK3 may be changed as occasion demands. In the case where the third thickness TK3 is decreased, improving electric characteristics of the semiconductor device 10 may be possible.

In the case where an isotropic dry etching process (e.g., a gas phase etching process) is used, the second semiconductor layer SCL2_2 having a crystallized structure may be delaminated from the tunnel insulating layer 216L. By contrast, in the case where the isotropic wet etching process is used, the second semiconductor layer SCL2_2 having a crystallized structure may not be delaminated from the tunnel insulating layer 216L.

According to some example embodiments of inventive concepts, an isotropic wet etching process may be performed on the second semiconductor layer SCL2_2 with the second thickness TK2, and thus, forming the second semiconductor layer SCL2_3 with the third thickness TK3, while preventing or reducing the likelihood of occurrence of the second semiconductor layer SCL2_2 from being delaminated from the tunnel insulating layer 216L may be possible.

According to some example embodiments of inventive concepts, a first isotropic etching process may be performed on the second semiconductor layer SCL2_1 having the first thickness TK1, and this increase uniformity in thickness of the second semiconductor layer SCL2_2 having the second thickness TK2 may be possible. After the first isotropic etching process, a second isotropic etching process may be performed on the second semiconductor layer SCL2_2 having the second thickness TK2, and reducing or minimizing a final thickness (i.e., the third thickness TK3) of the second semiconductor layer SCL2_3 may be possible.

In general, the second semiconductor layer SCL2_1 may be formed to have the same thickness or substantially the same thickness on an inner side surface of the tunnel insulating layer 216L and the lower semiconductor pattern 202. For example, the second semiconductor layer SCL2_1 may be formed to conformally an inner surface of the opening OP. However, when an etching process for thinning the second semiconductor layer SCL2_1 is performed, the second semiconductor layer SCL2_1 may be over-etched or partially removed. For example, a portion of the second semiconductor layer SCL2_1 may be removed from a sidewall of the opening OP. This may lead to deterioration in electric characteristics of a semiconductor device and/or in reliability of the semiconductor device.

According to some example embodiments of inventive concepts, the second semiconductor layer SCL2_1 or SCL2_2 may be formed to be thicker on the lower semiconductor pattern 202 than on the inner side surface of the tunnel insulating layer 216L and to fill the opening OP. For example, the second semiconductor layer SCL2_1 or SCL2_2 may be formed to have the same thickness as the diameter of the opening OP. In this case, when the second semiconductor layer SCL2_1 or SCL2_2 is etched, it may be possible to prevent the second semiconductor layer SCL2_1 or SCL2_2 from being over-etched at a region adjacent to the opening OP. Accordingly, preventing, or reducing the likelihood of occurrence of, electric characteristics of the upper semiconductor pattern 204 from being deteriorated may be possible. For example, preventing or reducing the likelihood of occurrence of electrical resistance of the upper semiconductor pattern 204 from being increased may be possible. Accordingly, improving reliability of the semiconductor device 10 may be possible.

Referring back to FIG. 3, an insulating filling layer (not shown) may be formed on the mold structure 20 to fill an inner space of the second semiconductor layer SCL2_3. Thereafter, a planarization process may be performed on the mold structure 20 to remove the insulating filling layer, the second semiconductor layer SCL2_3, the tunnel insulating layer 216L, the charge storing layer 214L, and the blocking insulating layer 212L from the topmost surface of the mold structure 20. The planarization process may expose the topmost surface of the mold structure 20. For example, the planarization process may include an etch-back process and/or a CMP process. Thus, the insulating filling pattern 206, the upper semiconductor pattern 204, the tunnel insulating pattern 216, the charge storing pattern 214, and the blocking insulating pattern 212 may be formed. For concise description, the insulating filling pattern 206, the upper semiconductor pattern 204, the tunnel insulating pattern 216, the charge storing pattern 214, and the blocking insulating pattern 212 will be referred to as a vertical pattern 200. In some example embodiments, the insulating filling layer and the insulating filling pattern 206 may be formed of or include at least one of silicon oxide or silicon nitride.

An upper portion of the vertical pattern 200 may be recessed to form a recess region. Thereafter, the conductive pad 310 may be formed in the recess region. The formation of the conductive pad 310 may include forming a conductive layer (not shown) on the vertical pattern 200 and the mold structure 20, and then planarizing the conductive layer exposing the topmost surface of the mold structure 20.

The mold structure 20 may be patterned forming isolation trenches (not shown). The isolation trenches may be spaced apart from the vertical patterns 200 and may be formed exposing the top surface 102 of the substrate 100. The isolation trenches may extend in the third direction D3. In some example embodiments, during the etching process, an upper portion of the substrate 100 may be over-etched or recessed. The isolation trenches may be arranged in the first direction D1. In other words, the isolation trenches may be spaced apart from each other in the first direction D1. The isolation trenches may extend in the second direction D2 and may penetrate the mold structure 20. For example, the mold structure 20 may be divided into a plurality of portions by the isolation trenches; however, inventive concepts are not limited thereto.

The sacrificial layers SL exposed by the isolation trenches may be removed. The removal of the sacrificial layers SL may include supplying an etching solution or an etching gas to the sacrificial layers SL exposed by the isolation trench to etch the sacrificial layers SL. The sacrificial layers SL may have an etch selectivity with respect to the insulating layers IL, and thus, the sacrificial layers SL may be selectively etched during the etching process, without etching the insulating layers IL. For example, the insulating layers IL may not be removed and may remain. The etching process may be or may include a wet etching process and/or an isotropic dry etching process. In the case where the sacrificial layers SL include silicon nitride and the insulating layers IL include silicon oxide, the etching process may be performed using an etching solution containing phosphoric acid. As a result of the etching process, top and bottom surfaces of the insulating layers IL and a side surface of the blocking insulating pattern 212 may be exposed.

The horizontal insulating layer 140 and the electrodes 130 may be formed in the regions formed by removing the sacrificial layers SL. The horizontal insulating layer 140 may cover the exposed top and bottom surfaces of the insulating layers IL and the sidewall of the blocking insulating pattern 212. For example, the formation of the horizontal insulating layer 140 may include an atomic layer deposition (ALD) process and/or a chemical vapor deposition (CVD) process. The horizontal insulating layer 140 may be provided to have a single or multi-layered structure.

The electrodes 130 may fill regions, which are formed by removing the sacrificial layers SL. The formation of the electrodes 130 may include forming a conductive layer (not shown) to fill the isolation trench and the recess regions, and then, removing the conductive layer from the isolation trench. In some example embodiments, the formation of the conductive layer may include depositing, e.g. sequentially depositing a barrier metal layer (not shown) and a metal layer (not shown). The barrier metal layer may be formed of or include at least one of metal nitrides (e.g., TiN, TaN, and WN), and the metal layer may be formed of or include at least one of metallic materials (e.g., W, Al, Ti, Ta, Co, and Cu). In some example embodiments, the removal of the conductive layer may include isotropically etching the conductive layer. Hereinafter, the insulating layers IL may be referred to as the insulating patterns 120. The electrodes 130 and the insulating patterns 120 therebetween will be referred to as an electrode structure 150.

The common source regions CSR may be formed in the substrate 100. The common source regions CSR may be formed by performing an ion implantation process on the substrate 100 exposed by isolation trenches. The common source regions CSR may have a conductivity type different from that of the lower semiconductor patterns 202. In certain embodiments, regions of the substrate 100 in contact with the lower semiconductor patterns 202 may have the same conductivity type as that of the lower semiconductor patterns 202. In the case of a FLASH memory device, the common source regions CSR may be electrically connected to be in an equipotential state. In certain embodiments, the common source regions CSR may be electrically separated from each other and may be allowed to have electric potentials different from each other.

The electrode separation pattern 230 may be formed on the common source region CSR filling the isolation trench. The electrode separation pattern 230 may be formed of or include at least one of silicon oxide, silicon nitride, and silicon oxynitride.

The interlayered insulating layer 320 may be formed on the electrode structures 150, the conductive pads 310, and the electrode separation patterns 230. In some example embodiments, the interlayered insulating layer 320 may be formed of or include at least one of silicon oxide or silicon nitride. Thereafter, the bit line contact plugs 340 may be electrically connected to the conductive pads 310, respectively. The bit line contact plugs 340 may ate the interlayered insulating layer 320. Thereafter, the bit lines BL may be formed on the interlayered insulating layer 320 to extend in the first direction D1 and may be electrically connected to the bit line contact plugs 340.

In general, at the region adjacent to the opening OP, the second semiconductor layer SCL2_1 or SCL2_2 may be over-etched or may be partially removed. This may lead to deterioration in electrical characteristics of the upper semiconductor pattern 204 (e.g., an increase in electrical resistance of the upper semiconductor pattern 204). Thus, reliability of the semiconductor device may be deteriorated.

According to some example embodiments of inventive concepts, at a region adjacent to the opening OP, preventing, or reducing the likelihood of occurrence of, the second semiconductor layer SCL2_1 or SCL2_2 from being excessively etched may be possible. Thus, the upper semiconductor pattern 204 may be formed to have a continuous structure in which there is no cut portion. Accordingly, preventing, or reducing the likelihood of occurrence of, electric characteristics of the upper semiconductor pattern 204 from being deteriorated may be possible, and thereby improving reliability of the semiconductor device 10 may be possible.

Figure 9:
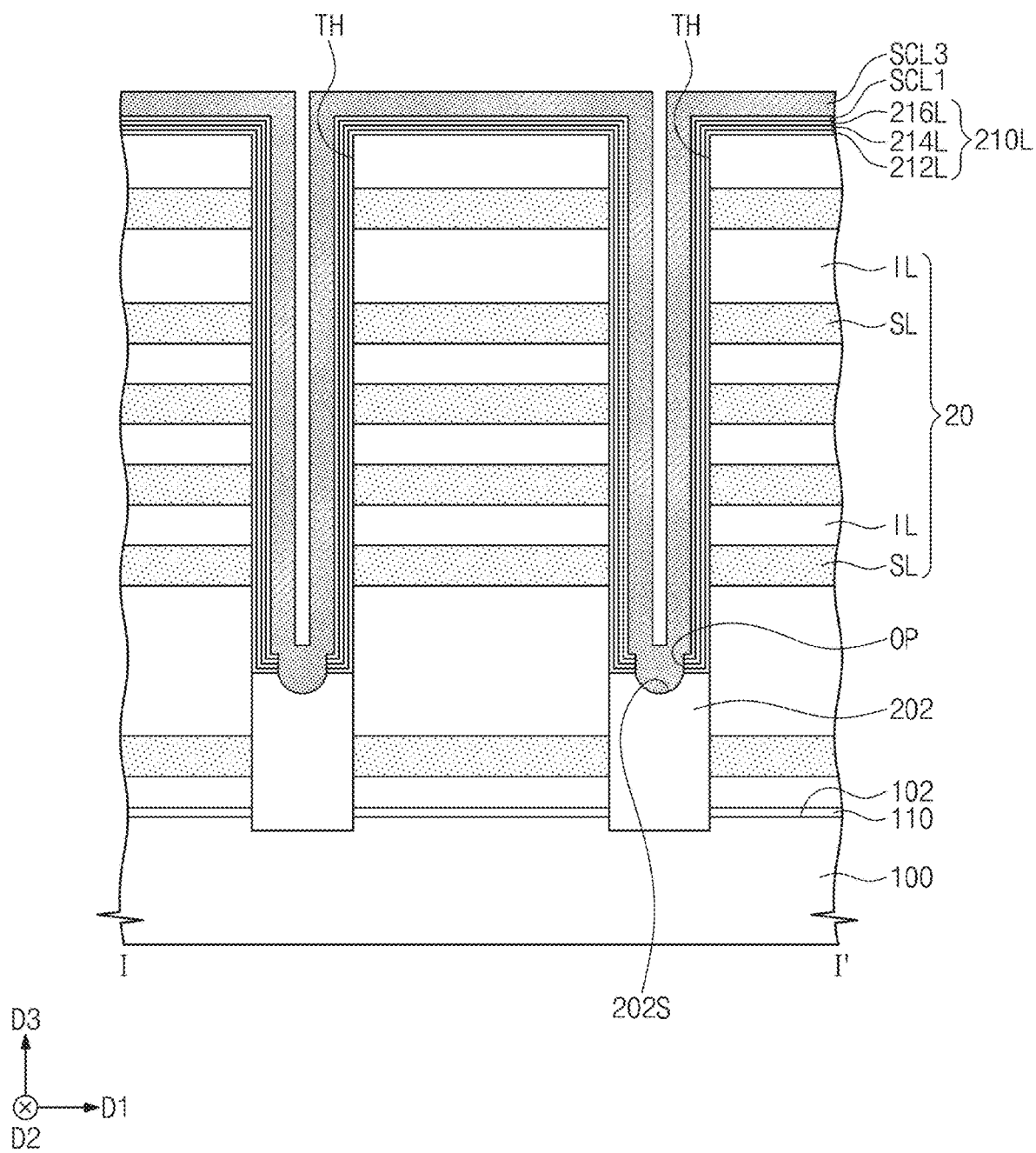
FIGS. 9 and 10 are sectional views, which are taken to correspond to the line I-I' of FIG. 2 and to illustrate a method of fabricating a semiconductor device according to some example embodiments of inventive concepts.
Figure 10:
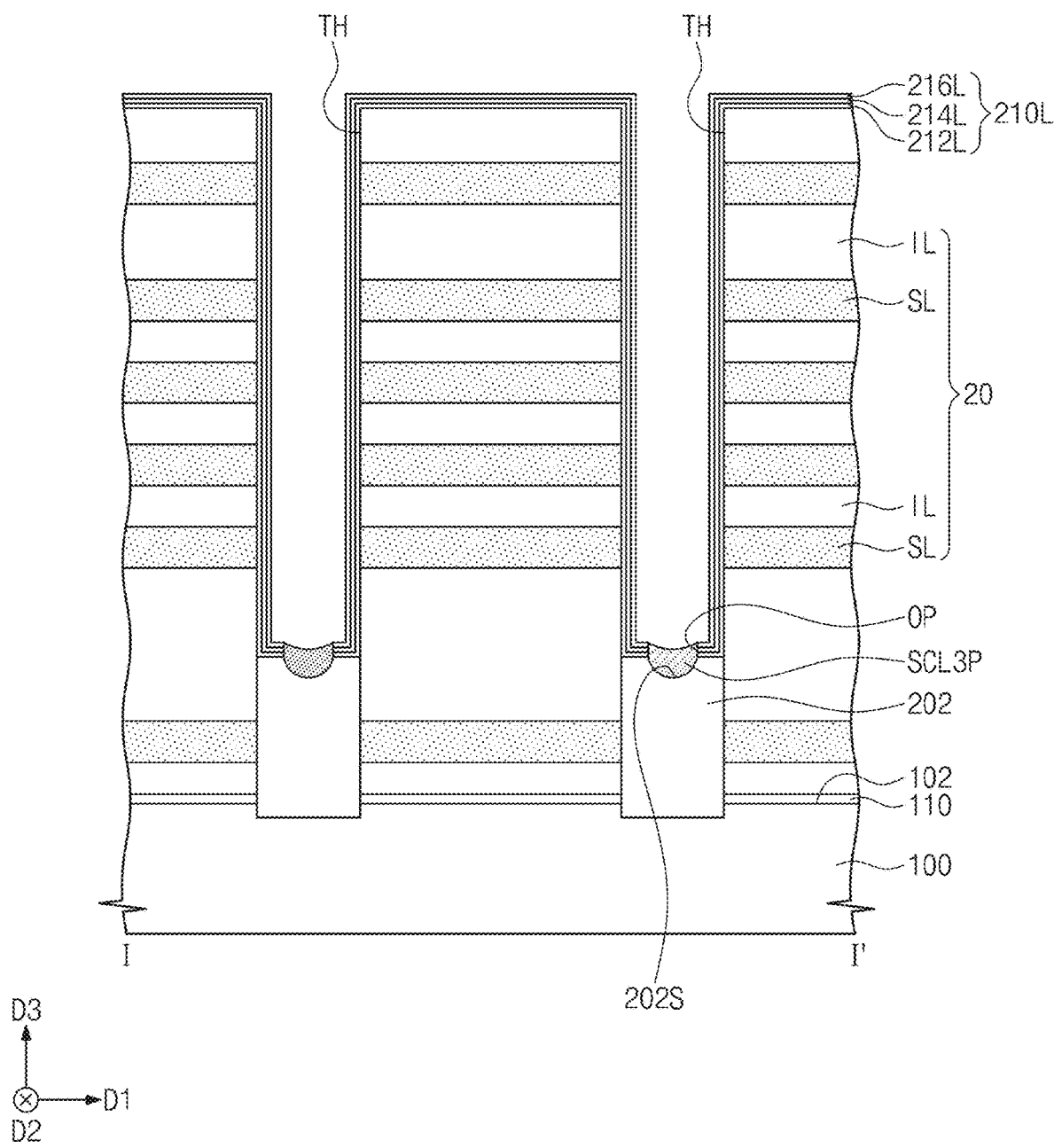

FIGS. 9 and 10 are sectional views, which are taken to correspond to the line I-I' of FIG. 2 and to illustrate a method of fabricating a semiconductor device according to some example embodiments of inventive concepts. For concise description, an element previously described with reference to FIGS. 5 to 8 may be identified by a similar or identical reference number without repeating an overlapping description thereof.

Referring to FIGS. 2 and 9, the mold structure 20 may be formed to have the through holes TH and the lower semiconductor patterns 202 may be formed to fill lower regions of the through holes TH. The blocking insulating layer 212L, the charge storing layer 214L, the tunnel insulating layer 216L, the first semiconductor layer SCL1, and a third semiconductor layer SCL3 may be formed on the lower semiconductor patterns 202. The mold structure 20, the through holes TH, the lower semiconductor patterns 202, the blocking insulating layer 212L, the charge storing layer 214L, the tunnel insulating layer 216L, and the first semiconductor layer SCL1 may be formed by the same method as that described with reference to FIG. 5.

Unlike that described with reference to FIG. 6, the first semiconductor layer SCL1 may not be removed. The third semiconductor layer SCL3 may be formed on the first semiconductor layer SCL1. The third semiconductor layer SCL3 may extend along an inner side surface of the first semiconductor layer SCL1 filling a region that is defined by the opening OP and a concave top surface 202S of the lower semiconductor pattern 202.

Referring to FIGS. 2 and 10, the third semiconductor layer SCL3 may be isotropically etched to form a third semiconductor gap-filling portion SCL3P. The third semiconductor gap-filling portion SCL3P may be formed to fill the region that is defined by the opening OP and the concave top surface 202S of the lower semiconductor pattern 202. The first semiconductor layer SCL1 may be removed during the isotropic etching process. The isotropic etching process may be an isotropic wet etching process or an isotropic dry etching process. The third semiconductor gap-filling portion SCL3P may have a top surface that is concavely recessed toward the lower semiconductor pattern 202.

Referring back to FIG. 8, a semiconductor layer (not shown) may be formed on an inner side surface of the tunnel insulating layer 216L, and then, the third semiconductor gap-filling portion SCL3P and the semiconductor layer may be thermally treated. As a result of the thermal treatment process, the third semiconductor gap-filling portion SCL3P and the semiconductor layer may be connected to each other, thereby forming a single semiconductor layer without any internal boundary. The single semiconductor layer may be the same as or substantially the same as the second semiconductor layer SCL2_3 described with reference to FIG. 8.

The subsequent process may be performed by the same method as that described with reference to FIG. 3, and as a result, the semiconductor device 10 may be formed.

According to some example embodiments of inventive concepts, the upper semiconductor pattern 204 may have a continuous structure in which there is no cut portion (in particular, at a region adjacent to the opening OP). Accordingly, preventing, or reducing the likelihood of occurrence of, electric characteristics of the upper semiconductor pattern 204 from being deteriorated may be possible, and thereby improving reliability of the semiconductor device 10 may be possible.

FIGS. 11 to 14 are sectional views, which are taken to correspond to the line I-I' of FIG. 2 and to illustrate a method of fabricating a semiconductor device according to some example embodiments of inventive concepts. For concise description, an element previously described with reference to FIGS. 5 to 8 may be identified by a similar or identical reference number without repeating an overlapping description thereof.

Figure 11:
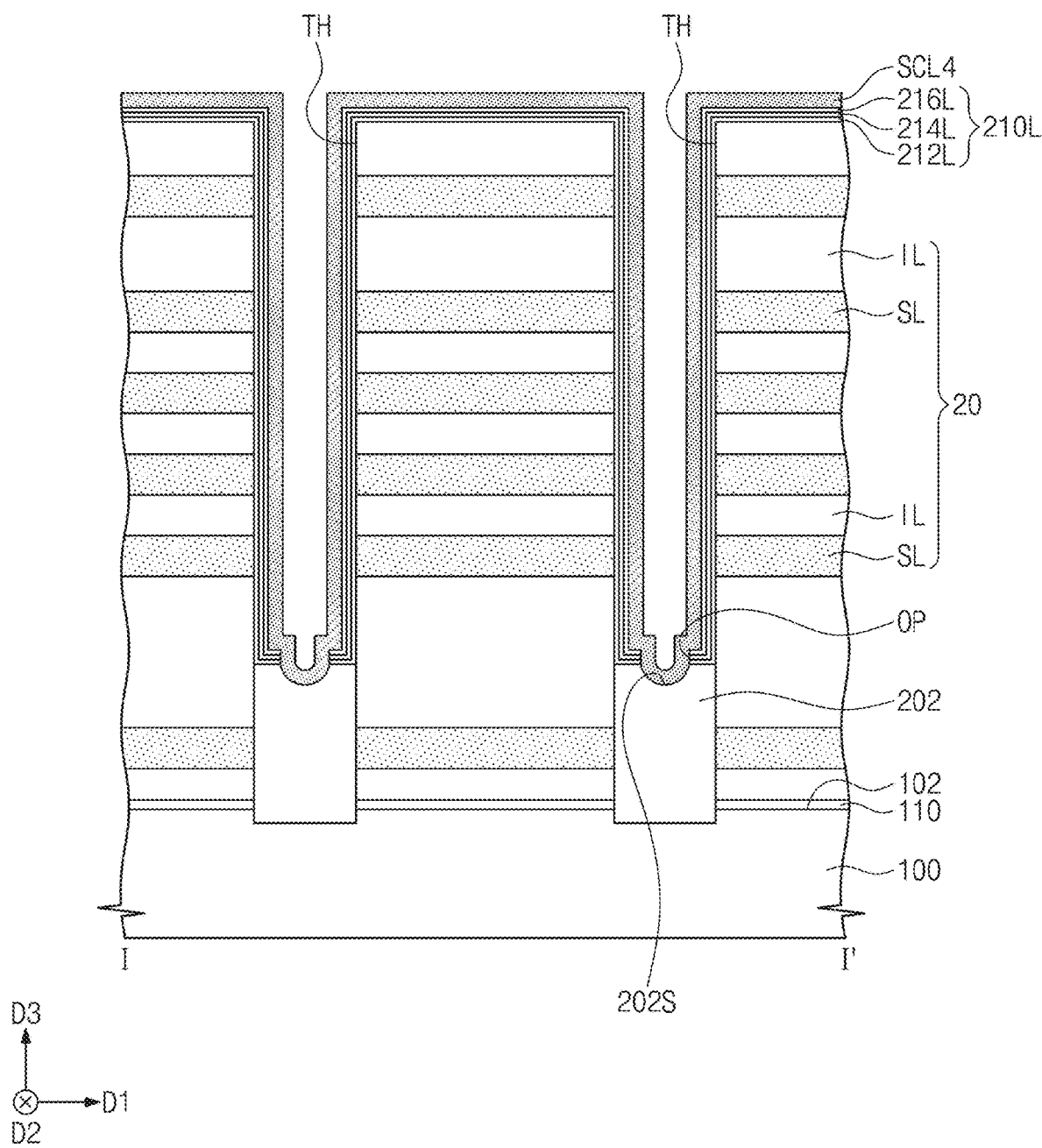
FIGS. 11 to 14 are sectional views, which are taken to correspond to the line I-I' of FIG. 2 and to illustrate a method of fabricating a semiconductor device according to some example embodiments of inventive concepts.

Referring to FIGS. 2 and 11, the mold structure 20 may be formed having the through holes TH, and the lower semiconductor patterns 202 may be formed to fill lower regions of the through holes TH. Thereafter, the blocking insulating layer 212L, the charge storing layer 214L, and the tunnel insulating layer 216L may be formed on the lower semiconductor patterns 202. The mold structure 20, the through holes TH, the lower semiconductor patterns 202, the blocking insulating layer 212L, the charge storing layer 214L, and the tunnel insulating layer 216L may be formed by the same method as that described with reference to FIG. 5.

The lower semiconductor patterns 202 may have the concave top surfaces 202S, respectively. In the through holes TH, the blocking insulating layer 212L, the charge storing layer 214L, and the tunnel insulating layer 216L may be formed defining openings OP exposing the concave top surfaces 202S, respectively. The concave top surfaces 202S and the openings OP may be formed by the same method as that described with reference to FIG. 6.

A fourth semiconductor layer SCL4 may be formed on the tunnel insulating layer 216L. The formation of the fourth semiconductor layer SCL4 may include a chemical vapor deposition (CVD) process and/or an atomic layer deposition (ALD) process. In the through holes TH, the fourth semiconductor layer SCL4 may extend along an inner side surface of the tunnel insulating layer 216L. The fourth semiconductor layer SCL4 may be formed conformally covering sidewalls of the blocking insulating layer 212L, the charge storing layer 214L, and the tunnel insulating layer 216L, which are exposed by the opening OP, and the concave top surface 202S. In some example embodiments, the fourth semiconductor layer SCL4 may be formed of or include amorphous silicon.

Figure 12:
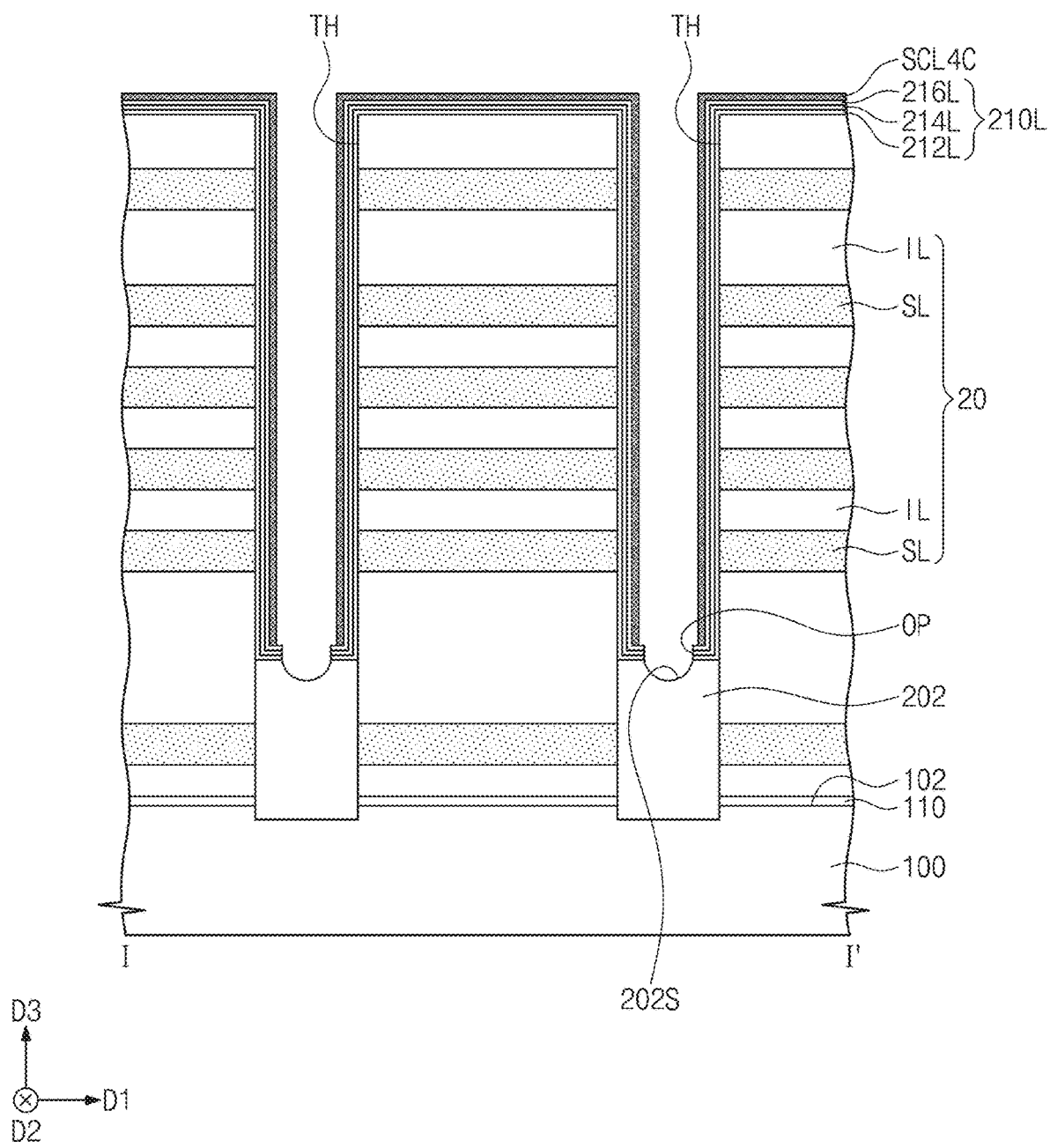

Referring to FIGS. 2 and 12, the fourth semiconductor layer SCL4 may be crystallized, and then, a portion of the fourth semiconductor layer SCL4 may be removed. In some example embodiments, the crystallization of the fourth semiconductor layer SCL4 may include performing a thermal treatment process on the fourth semiconductor layer SCL4. For example, owing to the crystallization of the fourth semiconductor layer SCL4, the fourth semiconductor layer SCL4 may be formed of or include a crystallized silicon layer.

As a result of the partial removal of the fourth semiconductor layer SCL4, a fourth semiconductor pattern SCL4C may be formed. The formation of the fourth semiconductor pattern SCL4C may include performing an anisotropic etching process on the fourth semiconductor layer SCL4. The anisotropic etching process may be performed to expose the concave top surface 202S. For example, the anisotropic etching process may be performed removing the fourth semiconductor layer SCL4 from the top surface of the tunnel insulating layer 216L adjacent to the opening, the concave top surface 202S of the lower semiconductor pattern 202 and the sidewalls of the blocking insulating layer 212L, the charge storing layer 214L, and the tunnel insulating layer 216L exposed by the opening. Thus, the fourth semiconductor pattern SCL4C may remain on a portion of the tunnel insulating layer 216L extending in a vertical direction.

Figure 13:
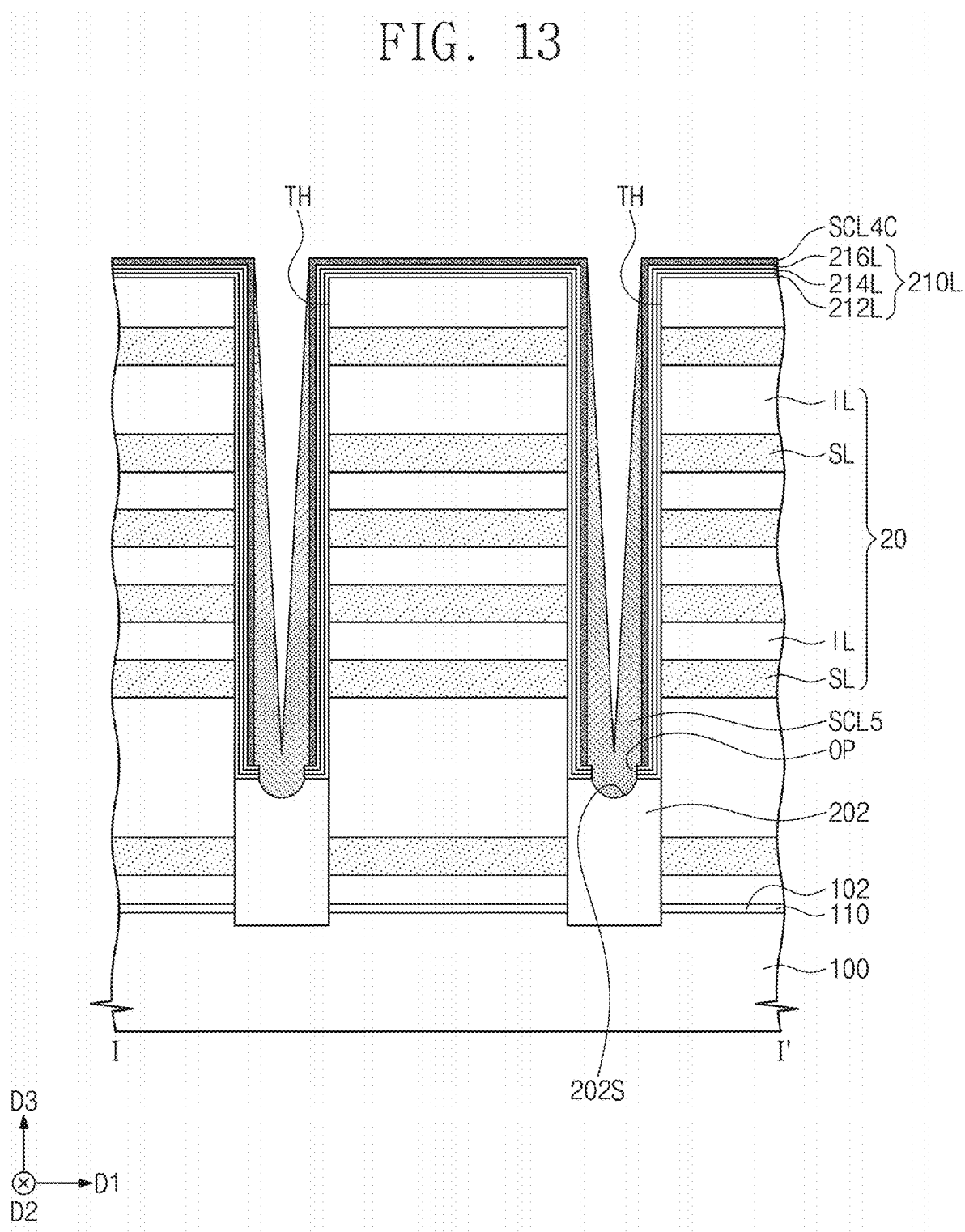

Referring to FIGS. 2 and 13, a fifth semiconductor layer SCL5 may be formed in the through hole TH. The fifth semiconductor layer SCL5 may extend along an inner side surface of the fourth semiconductor pattern SCL4C to fill a region enclosed by the opening OP and the concave top surface 202S. The inner side surface of the fifth semiconductor layer SCL5 may be inclined at an angle. In some example embodiments, the fifth semiconductor layer SCL5 may be formed of or include amorphous silicon.

Figure 14:
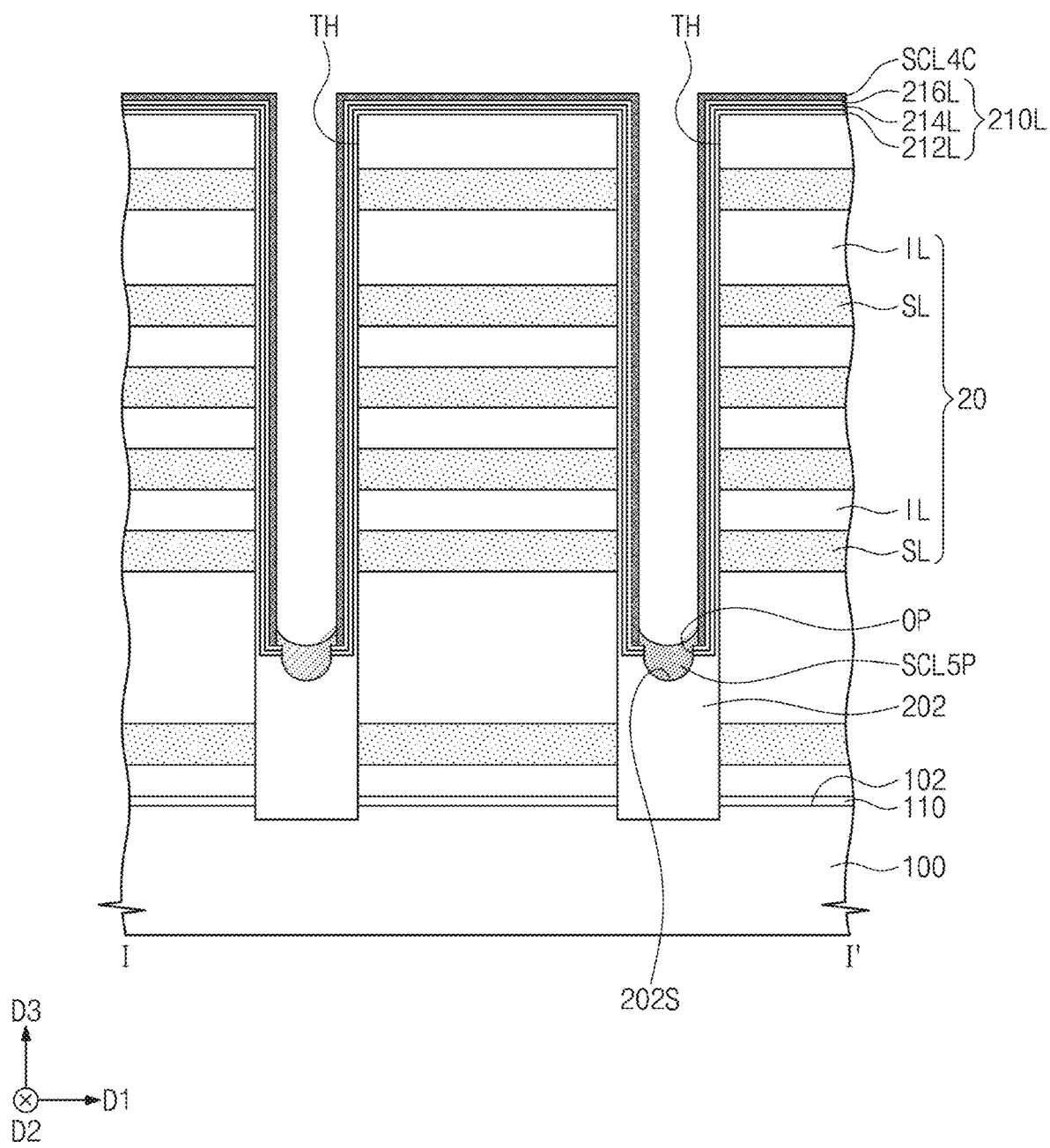

Referring to FIGS. 2 and 14, an upper portion of the fifth semiconductor layer SCL5 may be removed to form a fifth semiconductor gap-filling portion SCL5P. In some example embodiments, the upper portion of the fifth semiconductor layer SCL5 may be removed by an isotropic etching process. The isotropic etching process may be or may include an isotropic dry etching process performed at a low temperature of about 270° C. or lower. In general, a crystallized semiconductor layer may not be etched by a low-temperature isotropic dry etching process. Thus, removing the upper portion of the fifth semiconductor layer SCL5 without the removal of the fourth semiconductor pattern SCL4C may be possible.

Referring back to FIG. 8, a thermal treatment process may be performed on the fourth semiconductor pattern SCL4C and the fifth semiconductor gap-filling portion SCL5P. The fifth semiconductor gap-filling portion SCL5P may be crystallized by the thermal treatment process. Furthermore, as a result of the thermal treatment process, the fifth semiconductor gap-filling portion SCL5P and the fourth semiconductor pattern SCL4C may be connected to each other, thereby forming a single semiconductor layer without any internal boundary. The single semiconductor layer may be the same or substantially the same as the second semiconductor layer SCL2_3 described with reference to FIG. 8.

The subsequent process may be performed by the same method as that described with reference to FIG. 3, and as a result, a semiconductor device may be formed.

According to some example embodiments of inventive concepts, the upper semiconductor pattern 204 may have a continuous structure in which there is no cut portion (in particular, at a region adjacent to the opening OP). Accordingly, preventing, or reducing the likelihood of occurrence of, electric characteristics of the upper semiconductor pattern 204 from being deteriorated may be possible, and thereby improving reliability of the semiconductor device 10 may be possible.

Figure 15:
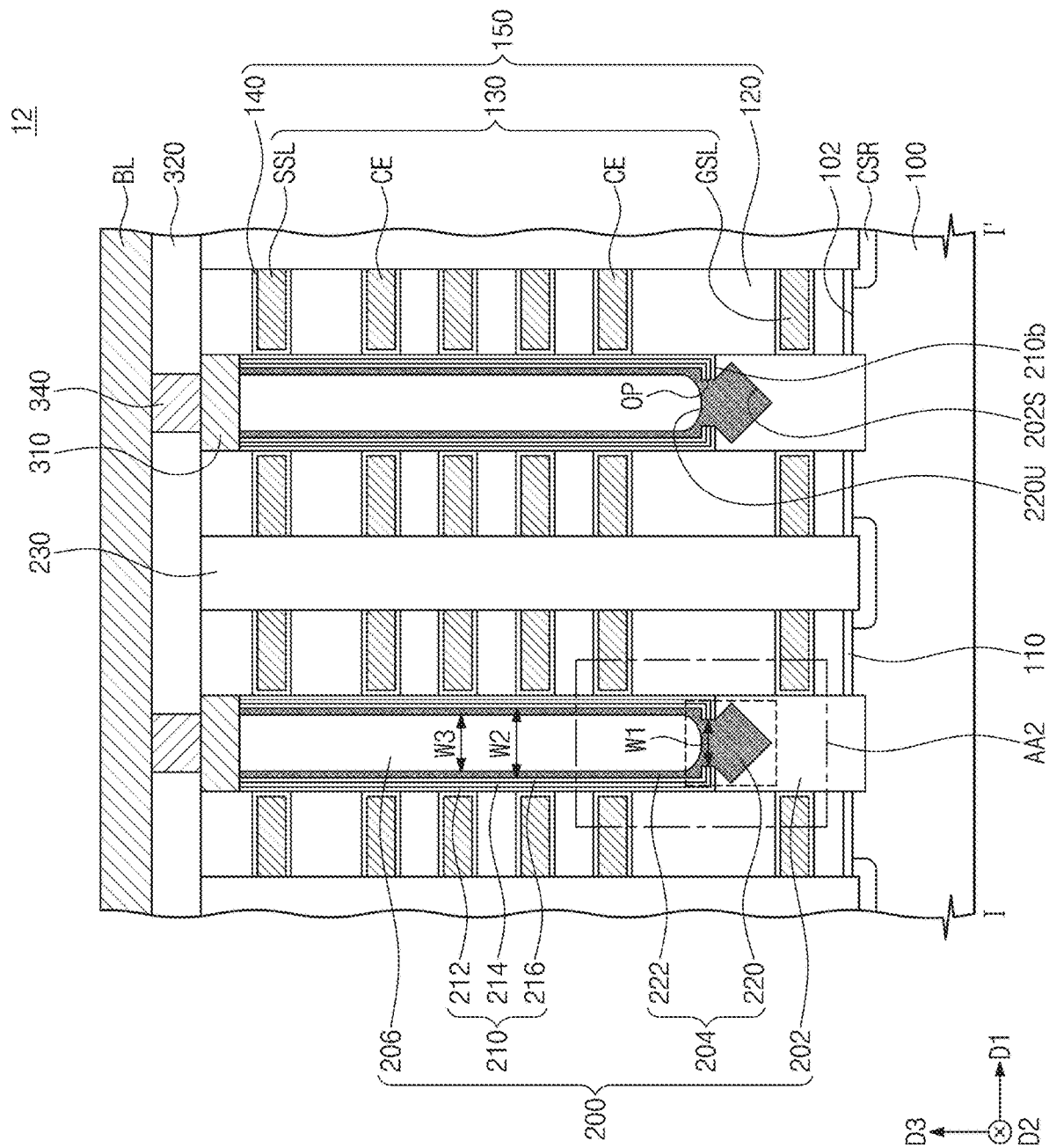
FIG. 15 is a sectional view, which is taken to correspond to the line I-I' of FIG. 2 and to illustrate a semiconductor device according to some example embodiments of inventive concepts.
Figure 16:
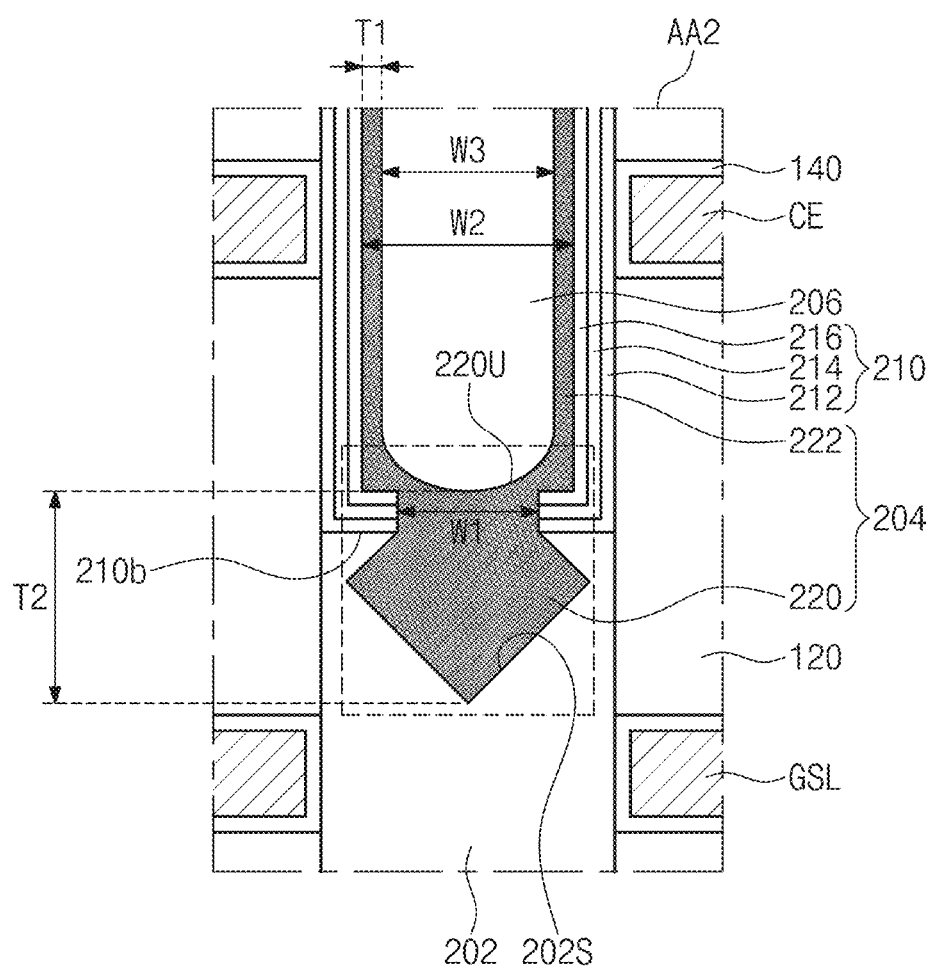
FIG. 16 is an enlarged view illustrating a portion 'AA2' of FIG. 15.

FIG. 15 is a sectional view, which is taken to correspond to the line I-I' of FIG. 2 and to illustrate a semiconductor device according to some example embodiments of inventive concepts. FIG. 16 is an enlarged view illustrating a portion 'AA2' of FIG. 15. For concise description, an element previously described with reference to FIGS. 2 to 4 may be identified by a similar or identical reference number without repeating an overlapping description thereof. A semiconductor device 12 according to the example embodiments may be the same or substantially the same as those of the semiconductor device 10 described with reference to FIGS. 2 to 4, except for a difference in shape of the gap-filling portion 220. Hereinafter, the shape of the gap-filling portion 220 will be described.

Referring to FIGS. 15 and 16, the gap-filling portion 220 may have a top-truncated diamond shape. The gap-filling portion 220 may have side portions, which are tapered in two opposite lateral directions (e.g., the first direction D1 and its opposite direction). A width of the gap-filling portion 220 may increase gradually and then decrease gradually, when measured in a direction toward the substrate 100.

The concave top surface 202S may be formed in such a way that a gap region defined thereby has a top-truncated diamond shape, unlike the concave top surface 202S of the lower semiconductor pattern 202 described with reference to FIGS. 2 to 4.

Except for a process of etching the top surface of the lower semiconductor pattern 202, the method of FIGS. 15 and 16 may be the same or substantially the same as that of FIGS. 5 to 8. For concise description, a previously-described element or step may be identified by a similar or identical reference number without repeating an overlapping description thereof.

An isotropic wet etching process may be performed on the top surface of the lower semiconductor pattern 202 exposed by the opening OP. The etchant to be used for the isotropic wet etching process may be selected to allow the lower semiconductor pattern 202 to have a top-truncated diamond shape. Thus, the concave top surface 202S of the lower semiconductor pattern 202 may be formed to define a top-truncated diamond-shaped gap region. After the etching of the top surface of the lower semiconductor pattern 202, the upper semiconductor pattern 204 may be formed on the lower semiconductor pattern 202 to fill the gap region defined by the concave top surface 202S.

The subsequent process may be performed by the same method as that described with reference to FIGS. 6 to 8, and as a result, the semiconductor device 12 may be formed. According to some example embodiments of inventive concepts, the upper semiconductor pattern 204 may have a continuous structure in which there is no cut portion (in particular, at a region adjacent to the opening OP). Accordingly, preventing, or reducing the likelihood of occurrence of, electric characteristics of the upper semiconductor pattern 204 from being deteriorated may be possible, and thereby improving reliability of the semiconductor device 12 may be possible.

Figure 17:
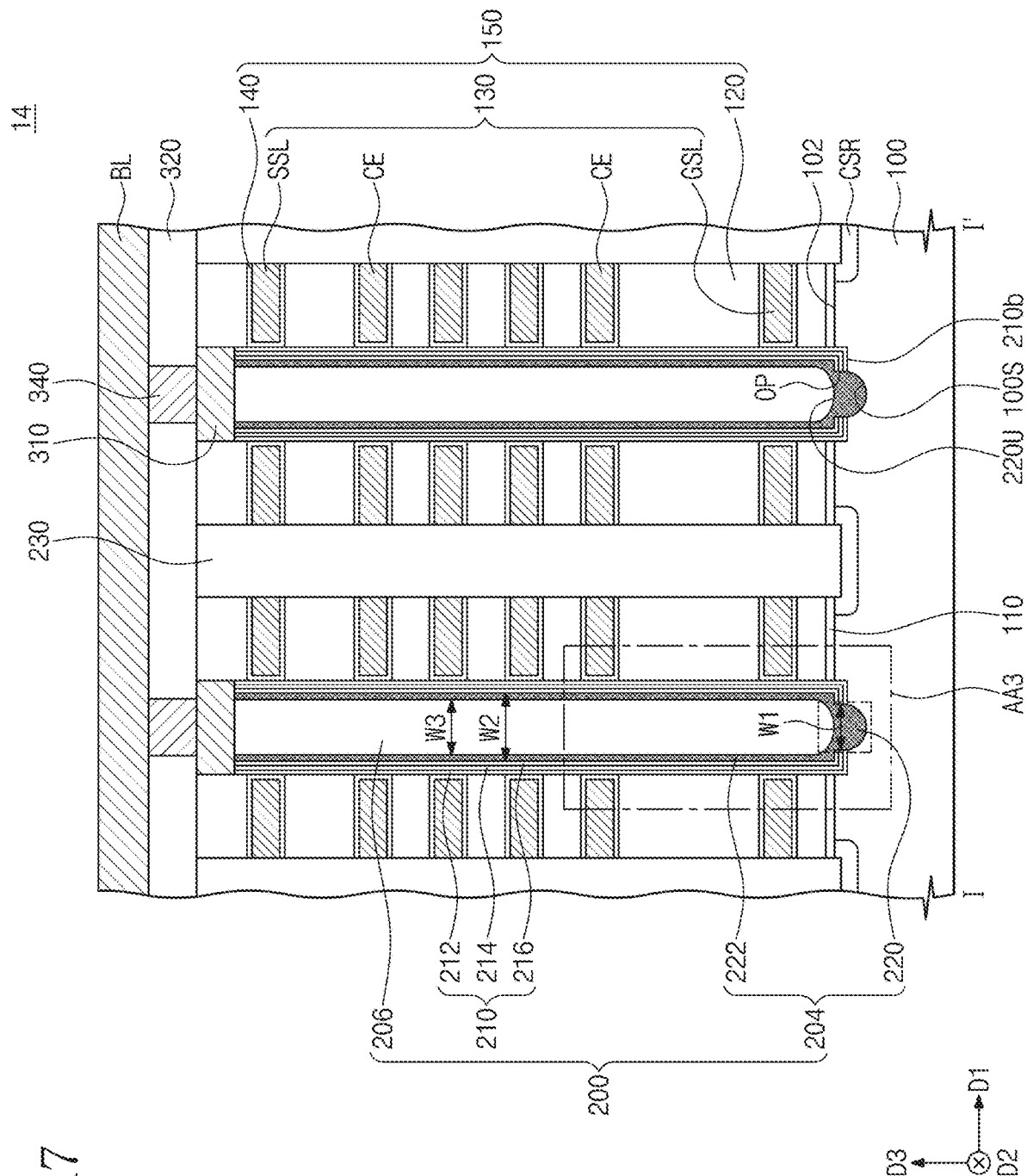
FIG. 17 is a sectional view, which is taken to correspond to the line I-I' of FIG. 2 and to illustrate a semiconductor device according to some example embodiments of inventive concepts.
Figure 18:
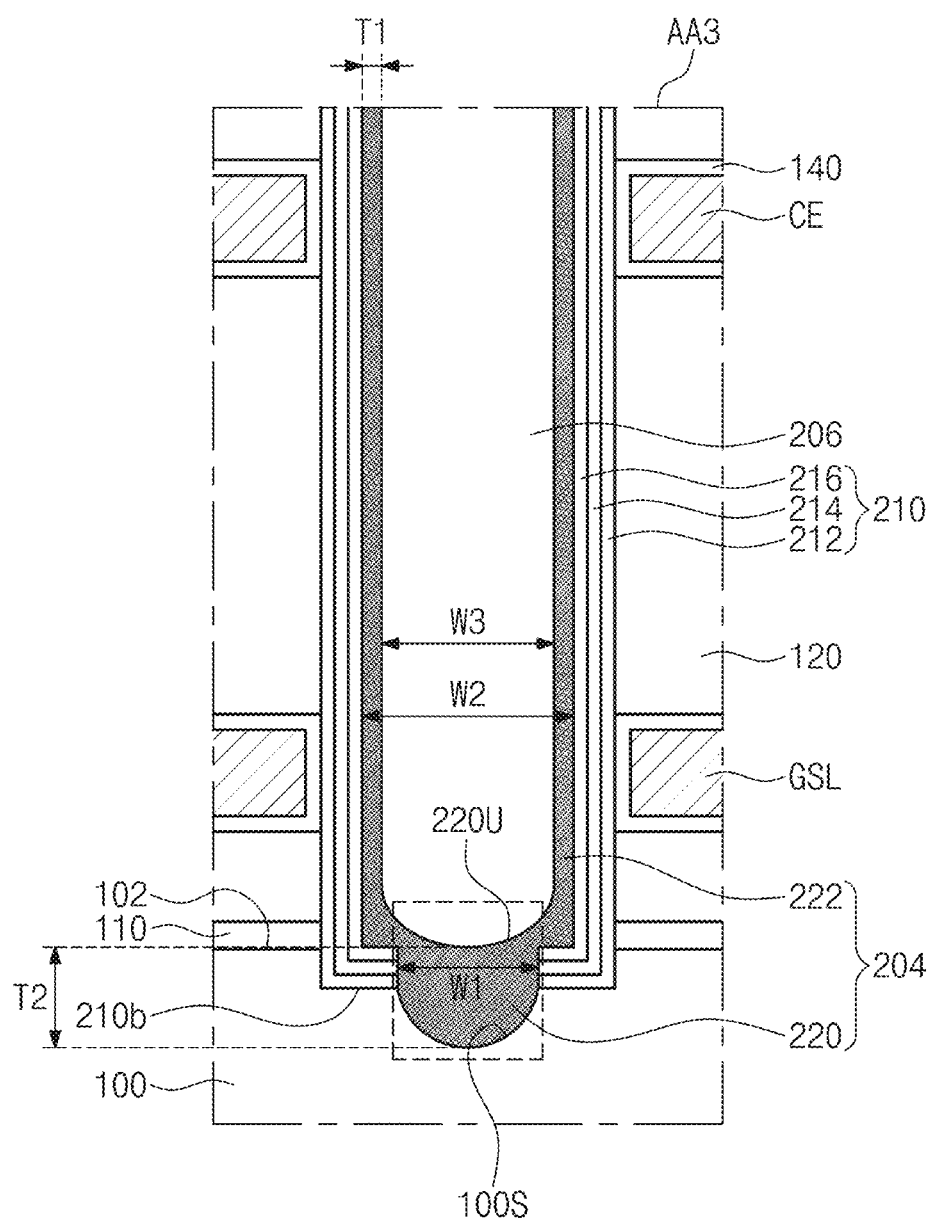
FIG. 18 is an enlarged view illustrating a portion 'AA3' of FIG. 17.

FIG. 17 is a sectional view, which is taken to correspond to the line I-I' of FIG. 2 and to illustrate a semiconductor device according to some example embodiments of inventive concepts. FIG. 18 is an enlarged view illustrating a portion 'AA3' of FIG. 17. For concise description, an element previously described with reference to FIGS. 2 to 4 may be identified by a similar or identical reference number without repeating an overlapping description thereof. A semiconductor device 14 according to the example embodiments may be the same or substantially the same as those of the semiconductor device 10 described with reference to FIGS. 2 to 4, except that the lower semiconductor pattern 202 is not formed.

Referring to FIGS. 17 and 18, the vertical patterns 200 may not include a lower semiconductor pattern, unlike that described with reference to FIG. 3. In other words, each of the vertical patterns 200 may include the vertical insulating pattern 210, the upper semiconductor pattern 204, and the insulating filling pattern 206. The vertical patterns 200 may extend from the top surface 102 of the substrate 100 in the third direction D3. Bottom surfaces of the vertical patterns 200 may be positioned at a height lower than that of the lowermost one of the electrodes 130.

The substrate 100 may have concave top surfaces 100S that are concavely recessed toward an inner portion of the substrate 100. For example, the concave top surfaces 100S may be formed to have a concave and rounded shape. The vertical patterns 200 may be formed on the concave top surfaces 100S, respectively.

The upper semiconductor pattern 204 may have the same or substantially the same shape as that described with reference to FIGS. 2 to 4. However, the upper semiconductor pattern 204 may be horizontally overlapped with the ground selection lines GSL, unlike that described with reference to FIGS. 2 to 4.

The gap-filling portion 220 may fill a region defined by the concave top surface 100S of the substrate 100. The gap-filling portion 220 may include a lower portion provided in the substrate 100 and an upper portion provided on the top surface 102 of the substrate 100; however, inventive concepts is not limited thereto. For example, in certain embodiments, the entire portion of the gap-filling portion 220 may be provided in the substrate 100. The gap-filling portion 220 may have a bottom portion that is located below a bottom surface of the blocking insulating pattern 212. In some example embodiments, the bottom portion of the gap-filling portion 220 may have a convexly rounded surface that is in contact with the substrate 100. The top surface 220U of the gap-filling portion 220 may be located below the ground selection lines GSL. For example, the top surface 220U of the gap-filling portion 220 may be positioned between the top surface 102 of the substrate 100 and the bottom surface of the ground selection line GSL, when measured from the substrate 100. In certain embodiments, the top surface 220U of the gap-filling portion 220 may be located below the top surface 102 of the substrate 100.

According to some example embodiments of inventive concepts, the upper semiconductor pattern 204 may have a continuous structure in which there is no cut portion e.g., at a region adjacent to the opening OP. Accordingly, preventing, or reducing the likelihood of occurrence of, electric characteristics of the upper semiconductor pattern 204 from being deteriorated and thereby to improve reliability of the semiconductor device 14.

Figure 19:
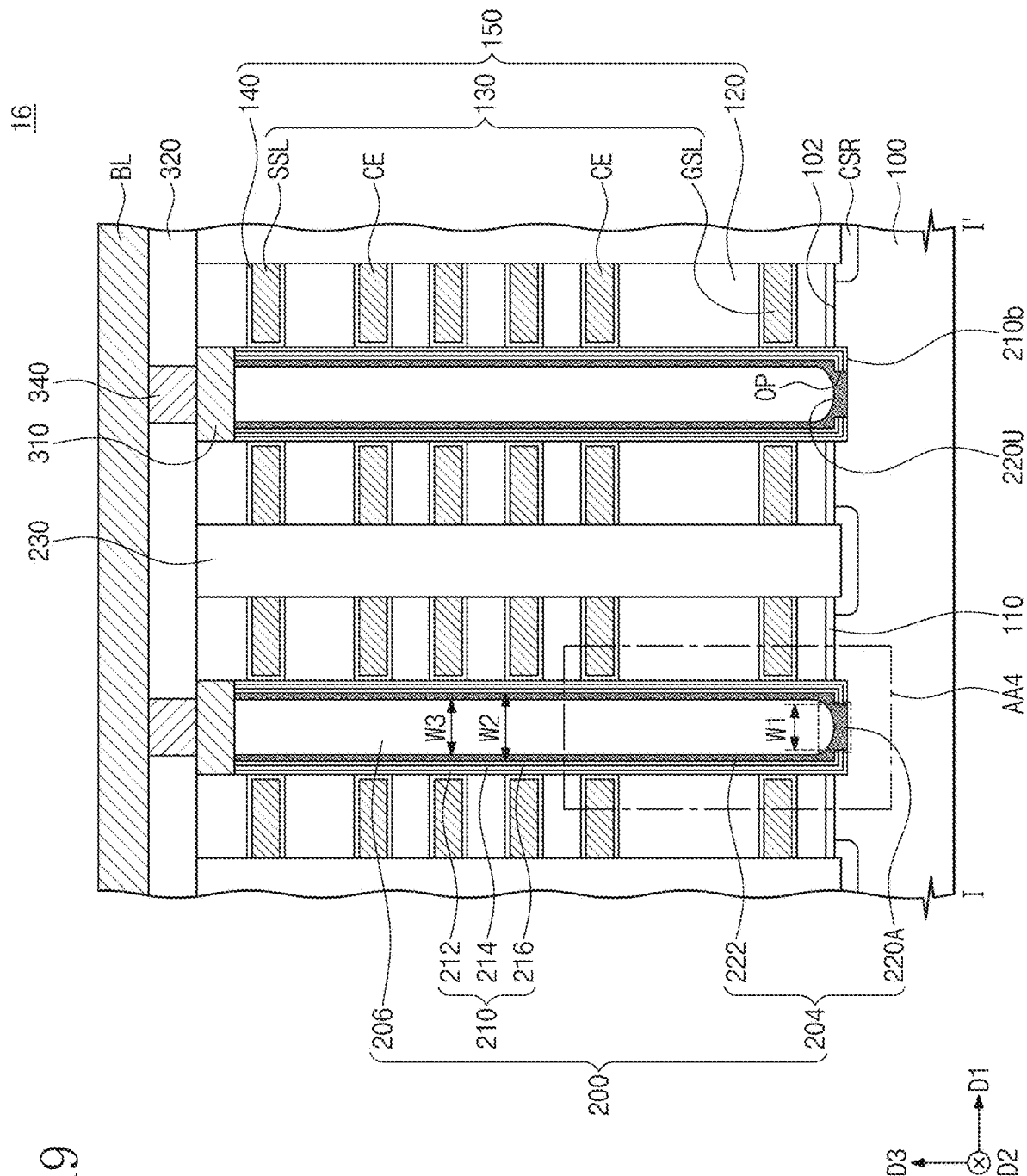
FIG. 19 is a sectional view, which is taken to correspond to the line I-I' of FIG. 2 and to illustrate a semiconductor device according to some example embodiments of inventive concepts.
Figure 20:
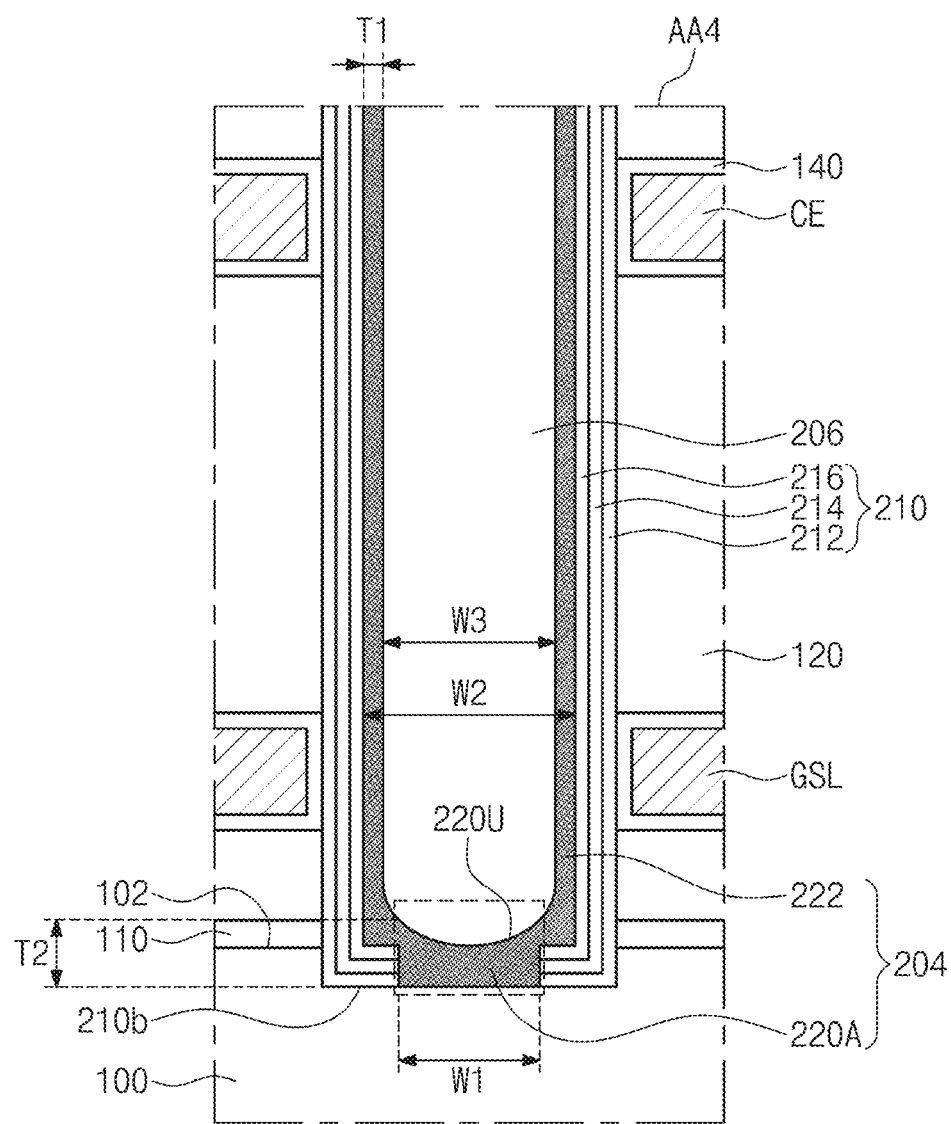
FIG. 20 is an enlarged view illustrating a portion 'AA4' of FIG. 19.

FIG. 19 is a sectional view, which is taken to correspond to the line I-I' of FIG. 2 and to illustrate a semiconductor device according to some example embodiments of inventive concepts. FIG. 20 is an enlarged view illustrating a portion 'AA4' of FIG. 19. For concise description, an element previously described with reference to FIGS. 17 and 18 may be identified by a similar or identical reference number without repeating an overlapping description thereof. A semiconductor device 16, according to some example embodiments of inventive concepts, may be the same or substantially the same as those of the semiconductor device 14 described with reference to FIGS. 17 and 18, except for a difference in shape of the bottom surface of the gap-filling portion 220.

Referring to FIGS. 19 and 20, similar to that described with reference to FIGS. 17 and 18, the vertical patterns 200 may include the vertical insulating pattern 210, the upper semiconductor pattern 204, and the insulating filling pattern 206. The vertical patterns 200 may extend from the top surface 102 of the substrate 100 in the third direction D3. The bottom surfaces of the vertical patterns 200 may be positioned at a height lower than that of the lowermost one of the electrodes 130.

Unlike that described with reference to FIGS. 17 and 18, a gap-filling portion 220A may have a flat bottom surface. The gap-filling portion 220A may have a bottom surface that is coplanar with that of the blocking insulating pattern 212. The top surface 220U of the gap-filling portion 220A may be located at a height lower than the ground selection lines GSL. For example, the top surface 220U of the gap-filling portion 220A may be positioned between the top surface 102 of the substrate 100 and the bottom surface of the ground selection line GSL. The upper semiconductor pattern 204 may be horizontally overlapped with the ground selection lines GSL.

According to some example embodiments of inventive concepts, the upper semiconductor pattern 204 may have a continuous structure in which there is no cut portion (in particular, at a region adjacent to the opening OP). Accordingly, it may be possible to prevent electric characteristics of the upper semiconductor pattern 204 from being deteriorated and thereby to improve reliability of the semiconductor device 16.

According to some example embodiments of inventive concepts, preventing, or reducing the likelihood of occurrence of, electric characteristics of a semiconductor device from being deteriorated may be possible. Thus, a semiconductor device with improved reliability may be provided.

While example embodiments of inventive concepts have been particularly shown and described, it will be understood by one of ordinary skill in the art that variations in form and detail may be made therein without departing from the spirit and scope of the attached claims.

What is claimed is:

1. A method of fabricating a semiconductor device, comprising:
forming a mold structure on a substrate, the mold structure comprising sacrificial layers and insulating layers that are alternatingly stacked on the substrate;
forming a through hole penetrating the mold structure;
forming a lower semiconductor pattern having a concave top surface, in a lower region of the through hole; and
forming an upper semiconductor pattern on the lower semiconductor pattern,
wherein the forming of the upper semiconductor pattern includes,
forming a second semiconductor layer to fill at least a portion of the through hole,
performing a first etching process, after the forming of the second semiconductor layer,
performing a thermal treatment process, after the first etching process, and
performing a second etching process, after the thermal treatment process.

2. The method of claim 1, wherein
the first etching process includes an isotropic dry etching process, and
the second etching process includes an isotropic wet etching process.

3. The method of claim 1, wherein the forming of the second semiconductor layer comprises:
forming a vertical insulating layer to cover a side surface of the through hole and a top surface of the lower semiconductor pattern;
forming an opening penetrating the vertical insulating layer and expose the concave top surface; and
forming the second semiconductor layer on the vertical insulating layer to fill a region enclosed by the concave top surface and the opening.

4. The method of claim 3, wherein the forming of the concave top surface and the opening comprises:
forming a first semiconductor layer on the vertical insulating layer;
etching the first semiconductor layer and the vertical insulating layer to form the opening exposing the top surface of the lower semiconductor pattern; and
performing an isotropic etching process on the top surface of the lower semiconductor pattern to form the concave top surface,
wherein the first semiconductor layer is removed by the isotropic etching process.

5. The method of claim 3, further comprising forming a first semiconductor layer between an inner side surface of the vertical insulating layer and the second semiconductor layer,
wherein the first etching process removes the second and first semiconductor layers from the inner side surface of the vertical insulating layer and exposes the inner side surface of the vertical insulating layer, and
after the first etching process, the second semiconductor layer is in the region enclosed by the concave top surface and the opening.

6. The method of claim 5, further comprising:
forming a third semiconductor layer on the exposed inner side surface of the vertical insulating layer; and
thermally treating the second and third semiconductor layers to crystallize the second and third semiconductor layers.

7. The method of claim 3, further comprising:
forming a fourth semiconductor pattern between the second semiconductor layer and the inner side surface of the vertical insulating layer,
wherein the forming of the fourth semiconductor pattern includes,
forming a fourth semiconductor layer to conformally cover the inner side surface of the vertical insulating layer and the concave top surface,
thermally treating the fourth semiconductor layer to crystallize the fourth semiconductor layer, and
performing an anisotropic etching process on the crystallized fourth semiconductor layer to form the fourth semiconductor pattern.

8. The method of claim 7, wherein the second semiconductor layer is formed extending along an inner side surface of the fourth semiconductor pattern and to fill the region enclosed by the concave top surface and the opening, and
the first etching process includes an isotropic etching process performed on the second semiconductor layer.

* * * * *